United States Patent
Jee et al.

(10) Patent No.: US 12,142,176 B2
(45) Date of Patent: Nov. 12, 2024

(54) DISPLAY DEVICE AND METHOD FOR INSPECTING DISPLAY DEVICE

(71) Applicant: Samsung Display Co., Ltd., Yongin-si (KR)

(72) Inventors: Ahnho Jee, Yongin-si (KR); Keunhyuk Youn, Yongin-si (KR); Wongu Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/345,855

(22) Filed: Jun. 30, 2023

(65) Prior Publication Data

US 2024/0096250 A1 Mar. 21, 2024

(30) Foreign Application Priority Data

Sep. 20, 2022 (KR) .................. 10-2022-0118455

(51) Int. Cl.
*G09G 3/00* (2006.01)
*G09G 3/32* (2016.01)

(52) U.S. Cl.
CPC .............. *G09G 3/006* (2013.01); *G09G 3/32* (2013.01); *G09G 2330/12* (2013.01)

(58) Field of Classification Search
CPC ....... G09G 3/006; G09G 3/32; G09G 2330/12
See application file for complete search history.

(56) References Cited

U.S. PATENT DOCUMENTS

| | | | |
|---|---|---|---|
| 9,495,893 B2 | 11/2016 | Park | |
| 2003/0116212 A1* | 6/2003 | Thomson | F16L 11/22 138/111 |
| 2014/0300649 A1* | 10/2014 | Park | G09G 3/3208 345/690 |
| 2016/0155788 A1* | 6/2016 | Kwon | H10K 59/131 257/40 |
| 2018/0342185 A1* | 11/2018 | Lee | G01R 27/08 |

FOREIGN PATENT DOCUMENTS

CN 208433410 U * 1/2019
KR 10-2037206 B1 10/2019

* cited by examiner

*Primary Examiner* — Stephen G Sherman
(74) *Attorney, Agent, or Firm* — Lewis Roca Rothgerber Christie LLP

(57) ABSTRACT

A display device includes a display panel including an active region, a peripheral region adjacent to the active region, pixels in the active region, a first crack line in the peripheral region to surround the portion of the active region in plan view, a second crack line in the peripheral region, under the first crack line, and insulated from the first crack line, and a third crack line in the peripheral region, above the first crack line, and insulated from the first crack line and the second crack line.

18 Claims, 17 Drawing Sheets

DISPLAY DEVICE AND METHOD FOR INSPECTING DISPLAY DEVICE

CROSS-REFERENCE TO RELATED APPLICATION

This application claims to, and the benefit of, Korean Patent Application No. 10-2022-0118455 filed on Sep. 20, 2022, in the Korean Intellectual Property Office, the disclosures of which are incorporated by reference herein in their entireties.

BACKGROUND

Embodiments of the present disclosure described herein relate to a display device capable of inspecting the defect of the display device, and a method for inspecting the display device.

Recently, with the development of a technology, a display device including a flexible display device has been developed. A display panel includes a plurality of pixels to display an image and a driving chip to drive the pixels. The pixels are located in a display region of the display panel, and the driving chip is located in a non-display region surrounding the display region. A bending part is defined between the driving chip and the display region. The bending part is bent and located at a lower portion of the display panel.

A process of inspecting the defect and the crack of the display device is suitable for pre-shipment inspection of the display device to reduce the process failure rate of the display device.

SUMMARY

Embodiments of the present disclosure provide a display device having improved reliability in inspecting a defect, and a method for inspecting the display device.

According to one or more embodiments, a display device includes a display panel including an active region, a peripheral region adjacent to the active region, pixels in the active region, a first crack line in the peripheral region to surround the portion of the active region in plan view, a second crack line in the peripheral region, under the first crack line, and insulated from the first crack line, and a third crack line in the peripheral region, above the first crack line, and insulated from the first crack line and the second crack line.

The first crack line, the second crack line, and the third crack line may overlap each other in plan view.

The display panel may further include a first insulating layer between the first crack line and the second crack line, and a second insulating layer between the first crack line and the third crack line.

The display panel may further include an input pad coupled to a first end of the first crack line, an output pad coupled to a second end of the first crack line, a first connection pad coupled to the second crack line, and a second connection pad coupled to the third crack line.

A defective crack line among the first crack line, the second crack line, and the third crack line may be detected by using the first crack line, the second crack line, and the third crack line, in a first inspection mode wherein a defect position is detected by using two crack lines of the first crack line, the second crack line, and the third crack line, in a second inspection mode.

An input signal may be supplied to the input pad, and an output signal is output from the output pad, in the first inspection mode.

The input signal may be an alternating current signal that swings between a first voltage level and a second voltage level that is higher than the first voltage level.

A first direct current voltage corresponding to the first voltage level may be applied to the first connection pad, and a second direct current voltage corresponding to the second voltage level may be applied to the second connection pad, in the first inspection mode.

In the second inspection mode, one of the first crack line, the second crack line, or the third crack line may be coupled to a detector, wherein another one of the first crack line, the second crack line, or the third crack line is grounded.

The second crack line and the third crack line may surround the portion of the active region along the first crack line in plan view.

A pattern hole may be defined in the active region, wherein the first crack line, the second crack line, and the third crack line surround a portion of the pattern hole.

The display device may further include a driving circuit electrically coupled to the pixels, wherein the peripheral region includes a first region adjacent to the active region, a second region spaced apart from the first region in a first direction, and a bending region between the first region and the second region, and wherein the driving circuit is at the second region.

The first crack line, the second crack line, and the third crack line may be in the first region, the second region, and the bending region, respectively.

According to one or more embodiments, a method for inspecting a display device includes a display panel including an active region, a peripheral region adjacent to the active region, pixels in the active region, a first crack line in the peripheral region to surround a portion of the active region, a second crack line in the peripheral region and under the first crack line, a third crack line in the peripheral region and above the first crack line, and insulating layers respectively between respective ones of the first crack line, the second crack line, and the third crack line, when viewed in a plan view, and detecting a defect using the first crack line, the second crack line, or the third crack line, in a first inspection mode.

The display panel may further include an input pad coupled to a first end of the first crack line, an output pad coupled to a second end of the first crack line, a first connection pad coupled to the second crack line, and a second connection pad coupled to the third crack line.

The detecting of the defect in the first inspection mode may include supplying an input signal to the input pad, and receiving an output signal output from the output pad to detect the defect of the second crack line or the third crack line.

The input signal may be an alternating current (AC) signal that swings between a first voltage level, and a second voltage level that is higher than the first voltage level.

The detecting of the defect in the first inspection mode may further include applying a first direct current voltage, which corresponds to the first voltage level, to the first connection pad, and applying a second direct current voltage, which corresponds to the second voltage level, to the second connection pad.

The method may further include analyzing a defect position by using two crack lines of the first crack line, the second crack line, or the third crack line, in a second inspection mode.

The analyzing of the defective position may include connecting a Murray loop tester to one of the two crack lines, and grounding another one of the two crack lines.

BRIEF DESCRIPTION OF THE FIGURES

The above and other aspects of the present disclosure will become apparent by describing in detail embodiments thereof with reference to the accompanying drawings.

DETAILED DESCRIPTION

Figure 1:
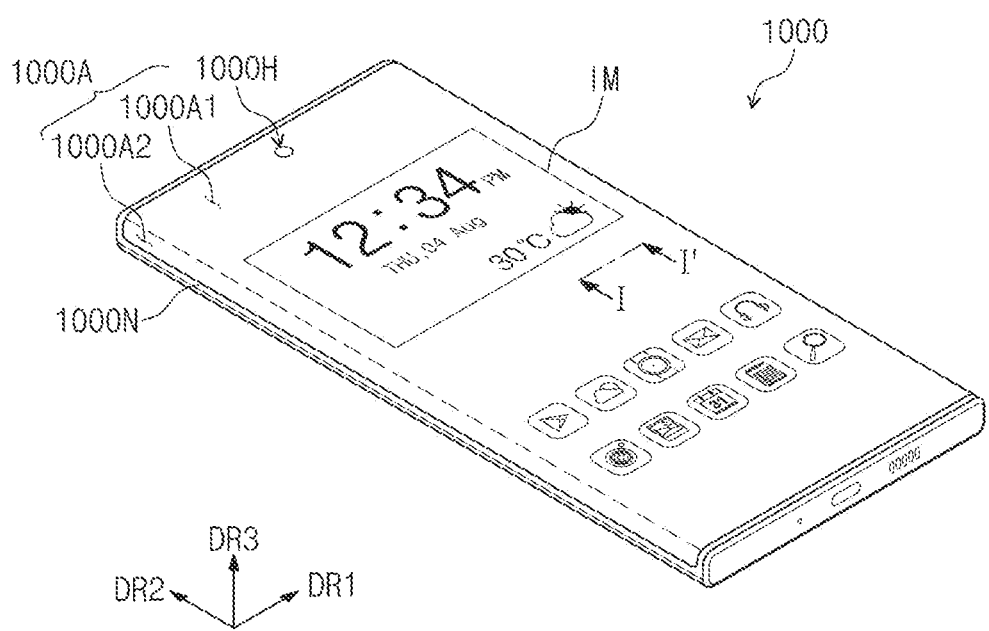
FIG. 1 is a perspective view illustrating a display device, according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region.

Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device, according to one or more embodiments of the present disclosure.

Referring to FIG. 1, a display device 1000 may be used for a large display device, such as a television, a monitor, or an outer billboard. Moreover, the display device 1000 may be used for small and medium display devices, such as a personal computer, a laptop computer, a personal digital terminal, a car navigation system, a game console, a smartphone, a tablet, or a camera. However, the above is provided only for the illustrative purpose, and various display devices may be provided without deviating from the scope and spirit of the present disclosure. FIG. 1 illustrates that the display device 1000 is the cellular phone.

An active region 1000A and a peripheral region 1000N may be defined in the display device 1000. The active region 1000A may display an image IM. The active region 1000A may have a first display surface 1000A1 parallel to a surface defined by a first direction DR1, and by a second direction DR2 crossing the first direction DR1, and a second display surface 1000A2 extending from the first display surface 1000A1.

The second display surface 1000A2 may be provided to be bent from one side of the first display surface 1000A1. In addition, a plurality of second display surfaces 1000A2 may be provided. In this case, the second display surface 1000A2 may be provided to be bent from one or more sides of the first display surface 1000A1. The active region 1000A may have one first display surface 1000A1 and one second display surface 1000A2, or may have as many as four second display surfaces 1000A2. However, the form of the active region 1000A is not limited thereto. For example, the active region 1000A may have the first display surface 1000A1.

The peripheral region 1000N may be adjacent to the active region 1000A. The peripheral region 1000N may be referred to as a bezel region.

A hole region 1000H may be surrounded by the active region 1000A. The hole region 1000H may be a region for transmitting or receiving an optical signal. For example, the hole region 1000H may be a region for, or corresponding to, an electronic part.

The thickness direction of the display device 1000 may be parallel to a third direction DR3 crossing the first direction DR1 and the second direction DR2. Accordingly, a front surface (or top surface) and a rear surface (or back surface) of members of the display device 1000 may be defined based on the third direction DR3.

Figure 2A:
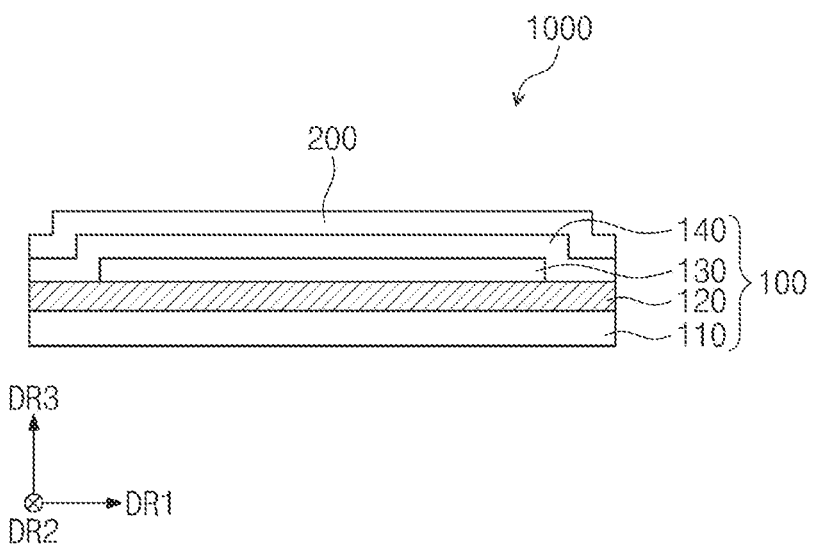
FIG. 2A is a cross-sectional view of a display device, according to one or more embodiments of the present disclosure.

FIG. 2A is a cross-sectional view of a display device, according to one or more embodiments of the present disclosure.

Referring to FIG. 2A, the display device 1000 may include a display panel 100 and an input sensor 200.

The display panel 100 may be a component that actually generates an image IM (refer to FIG. 1). The display panel 100 may be an emissive-type display panel. For example, the display panel 100 may be an organic light-emitting display panel, a quantum dot display panel, a micro-LED display panel, or a nano-LED display panel. The display panel 100 may include a base layer 110, a circuit layer 120, a light-emitting element layer 130, and an encapsulation layer 140.

The base layer 110 may be a member that provides a base surface for placing the circuit layer 120. The base layer 110 may be a glass substrate, a metal substrate, or a polymer substrate. However, one or more embodiments is not limited thereto, and the base layer 110 may be an inorganic layer, an organic layer, or a composite material layer.

The base layer 110 may have a multi-layer structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a "base barrier layer". Each of the first and second synthetic resin layers may include polyimide-based resin.

The circuit layer 120 may be located on the base layer 110. The circuit layer 120 may include an insulating layer, a semiconductor pattern, a conductive pattern, and a signal line. An insulating layer, a semiconductor layer, and a conductive layer may be formed on the base layer 110 through a coating or deposition process, and the insulating layer, the semiconductor layer, and the conductive layer may be selectively patterned through a plurality of photolithography processes. Thereafter, the semiconductor pattern, the conductive pattern, and the signal line included in the circuit layer 120 may be formed.

The light-emitting element layer 130 may be located on the circuit layer 120. The light-emitting element layer 130 may include a light-emitting device. For example, the light-emitting element layer 130 may include an organic light-emitting material, a quantum dot, a quantum rod, a micro-LED, or a nano-LED.

The encapsulation layer 140 may be located on the light-emitting element layer 130. The encapsulation layer 140 may protect the light-emitting element layer 130 from foreign substances, such as moisture, oxygen, and dust particles.

The input sensor 200 may be located on the display panel 100. The input sensor 200 may sense an external input applied from the outside.

The input sensor 200 may be located on the display panel 100 through subsequent processes. In this case, the input sensor 200 may be expressed as being directly located on the display panel 100. Here, the wording "directly located" may indicate that a third component is not interposed between the input sensor 200 and the display panel 100. In other words, a separate adhesive member may not be interposed between the input sensor 200 and the display panel 100. Alternatively, the input sensor 200 may be coupled to the display panel 100 through an adhesive member. The adhesive member may include a typical adhesive or an adhesion agent.

Figure 2B:
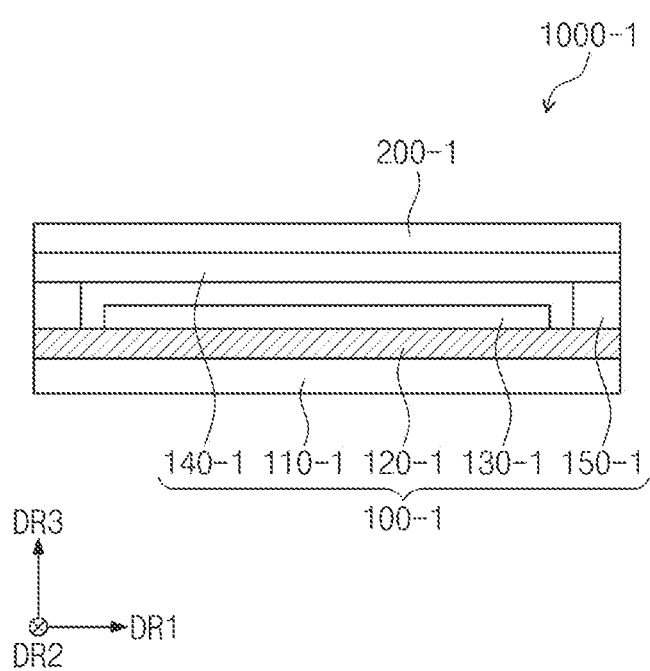
FIG. 2B is a cross-sectional view of a display device, according to one or more embodiments of the present disclosure.

FIG. 2B is a cross-sectional view of a display device, according to one or more embodiments of the present disclosure.

Referring to FIG. 2B, a display device 1000-1 may include a display panel 100-1 and an input sensor 200-1.

The display panel 100-1 may include a base substrate 110-1, a circuit layer 120-1, a light-emitting element layer 130-1, an encapsulation substrate 140-1, and a coupling member 150-1.

Each of the base substrate 110-1 and the encapsulation substrate 140-1 may include a glass substrate, a metal substrate, or a polymer substrate, but is not specifically limited thereto.

The coupling member 150-1 may be interposed between the base substrate 110-1 and the encapsulation substrate 140-1. The coupling member 150-1 may couple the encapsulation substrate 140-1 to the base substrate 110-1 or the circuit layer 120-1. The coupling member 150-1 may include an inorganic material or an organic material. For example, the inorganic material may include a frit seal, and the organic material may include a photo-curable material or a photo-plastic resin. However, a material constituting the coupling member 150-1 is not limited to the above example.

The input sensor 200-1 may be directly located on the encapsulation substrate 140-1. Here, the wording "directly located" may indicate that a third component is not interposed between the input sensor 200-1 and the encapsulation substrate 140-1. In other words, a separate adhesive member may not be interposed between the input sensor 200-1 and the display panel 100-1. However, the present disclosure is not limited thereto, and an adhesive layer may be further interposed between the input sensor 200-1 and the encapsulation substrate 140-1.

Figure 3:
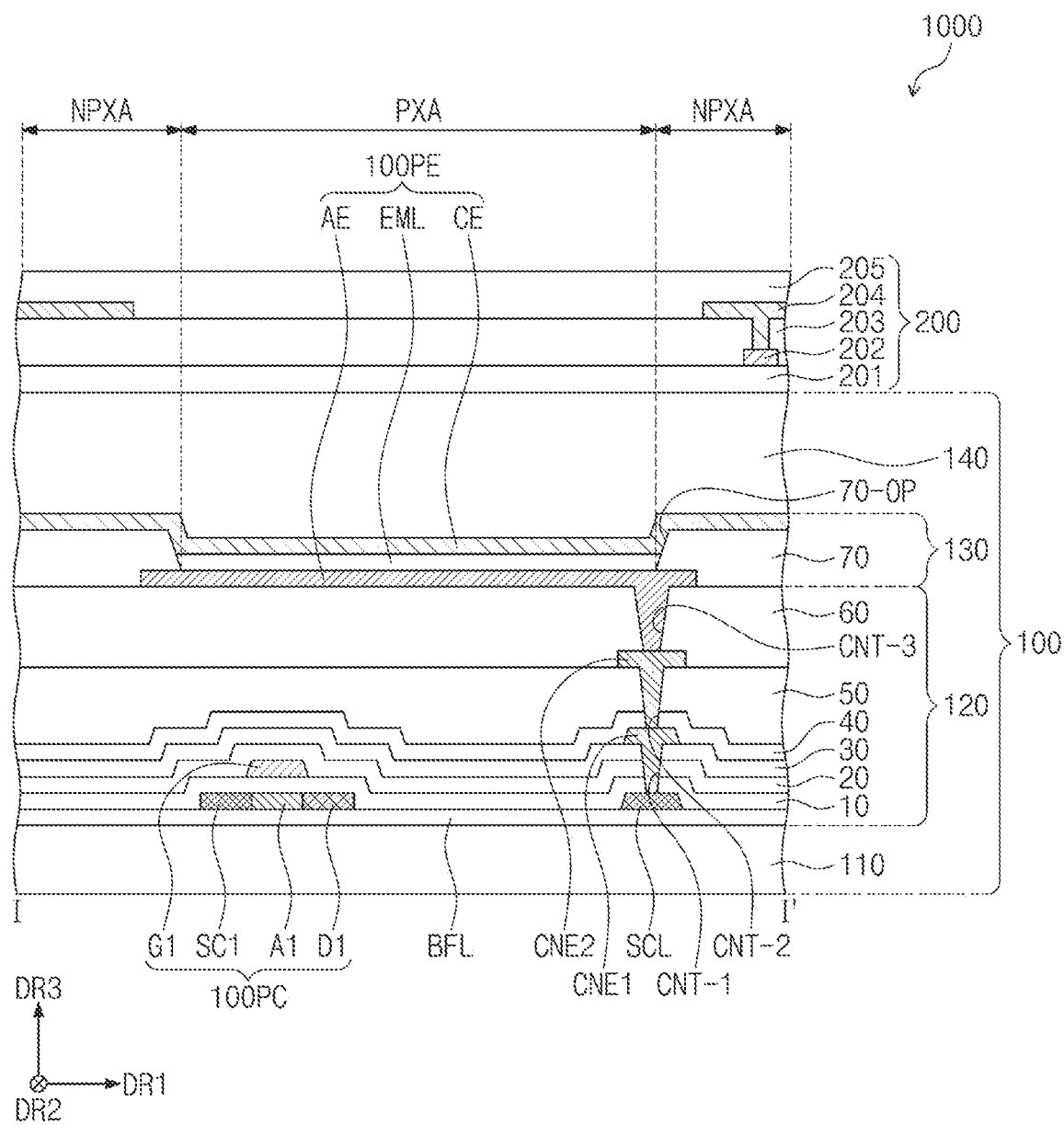
FIG. 3 is a cross-sectional view of a display device taken along the line I-I' of FIG. 1, according to one or more embodiments of the present disclosure.

FIG. 3 is a cross-sectional view of a display device taken along the line I-I' of FIG. 1, according to one or more embodiments of the present disclosure. In the following description made with reference to FIG. 3, components the same as the components that are described with reference to FIG. 2A are assigned with the same reference numerals, and the details thereof will be omitted.

Referring to FIG. 3, at least one inorganic layer may be formed on a top surface of the base layer 110. The inorganic layer may include at least one of an aluminum oxide, a titanium oxide, a silicon oxide, a silicon oxynitride, a zirconium oxide, or a hafnium oxide. The inorganic layer may be formed at multiple layers. Multiple inorganic layers may constitute a barrier layer and/or a buffer layer. The display panel 100 is illustrated as including a buffer layer BFL.

The buffer layer BFL may improve bonding force between the base layer 110 and a semiconductor pattern. The buffer layer BFL may include a silicon oxide layer and a silicon nitride layer, and the silicon oxide layer and the silicon nitride layer are alternately stacked.

The semiconductor pattern may be located on the buffer layer BFL. The semiconductor pattern may include polysilicon. However, the present disclosure is not limited thereto, and the semiconductor pattern may include amorphous silicon, low-temperature polycrystalline silicon, or an oxide semiconductor.

Some semiconductor patterns are merely illustrated in FIG. 3, and other semiconductor patterns may be further located in another region. The semiconductor patterns may be arranged according to a corresponding rule while crossing the pixels. The semiconductor pattern may have a different electrical property depending on whether being doped. The semiconductor pattern may include a first region having higher conductivity and a second region having lower conductivity. The first region may be doped with N-type dopants or P-type dopants. A P-type transistor may include a doping region doped with the P-type dopant, and an N-type transistor may include a doping region doped with the N-type dopant. The second region may be a non-doping region or may be a region doped at a concentration lighter than the concentration of the first region.

The conductivity of the first region may be higher than the conductivity of the second region. The first region may actually serve as an electrode or a signal line. In other words, a portion of the semiconductor pattern may be an active unit (or a channel unit) of a transistor, another portion of the semiconductor pattern may be a source or a drain of the transistor, and still another portion of the semiconductor pattern may be a connection electrode or a connection signal line.

Each of pixels may have an equivalent circuit including seven transistors, one capacitor, and a light-emitting device, and the equivalent circuit of the pixel may be modified in various forms. The details of the pixels will be described below. FIG. 3 illustrates that the pixel includes one transistor 100PC and one light-emitting element 100PE, by way of example.

The transistor 100PC may include a source SC1, a channel unit A1, a drain D1, and a gate G1. The source SC1, the channel unit A1, and the drain D1 may be formed from the semiconductor pattern. The source SC1 and the drain D1 may extend from the channel unit A1 in directions opposite to each other, when viewed from the cross-sectional view. A portion of a connection signal line SCL formed from the semiconductor pattern is illustrated in FIG. 3. In one or more embodiments, the connection signal line SCL may be connected with the drain D1 of the transistor 100PC when viewed from a plan view.

A first insulating layer 10 may be located on the buffer layer BFL. The first insulating layer 10 may be commonly provided in a plurality of pixels to cover the semiconductor pattern. The first insulating layer 10 may be an inorganic layer and/or an organic layer, and may have a single-layer structure or a multi-layer structure. The first insulating layer 10 may include at least one of an aluminum oxide, a titanium oxide, a silicon oxide, a silicon nitride, a silicon oxynitride, a zirconium oxide, or a hafnium oxide. The first insulating layer 10 may be a silicon oxide layer having a single-layer structure. The first insulating layer 10 and an insulating layer of the circuit layer 120, which is to be described later, may be an inorganic layer and/or an organic layer, and may have a single-layer structure or a multi-layer structure. The inorganic layer may include, but is not limited to, at least one of the above-described materials.

The gate G1 is located on the first insulating layer 10. The gate G1 may be a portion of a metal pattern. The gate G1 is overlapped with the channel unit A1. The gate G1 may function as a mask in a process of doping the semiconductor pattern.

A second insulating layer 20 may be located on the first insulating layer 10 and may cover the gate G1. The second insulating layer 20 may be commonly provided in the pixels. The second insulating layer 20 may be an inorganic layer and/or an organic layer, and may have a single-layer structure or a multi-layer structure. The second insulating layer 20 may include at least one of silicon oxide, silicon nitride, or silicon oxynitride. The second insulating layer 20 may have a multi-layer structure including a silicon oxide layer and a silicon nitride layer.

A third insulating layer 30 may be located on the second insulating layer 20. The third insulating layer 30 may have a single-layer or multi-layer structure. The third insulating layer 30 may have a multi-layer structure including a silicon oxide layer and a silicon nitride layer.

A first connection electrode CNE1 may be located on the third insulating layer 30. The first connection electrode CNE1 may be connected to the connection signal line SCL through a contact hole CNT-1 formed through the first insulating layer 10, the second insulating layer 20, and the third insulating layer 30.

A fourth insulating layer 40 may be located on the third insulating layer 30. The fourth insulating layer 40 may be a single silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 formed through the fourth insulating layer 40, and the fifth insulating layer 50.

A sixth insulating layer 60 may be located on the fifth insulating layer 50 to cover the second connection electrode CNE2. The sixth insulating layer 60 may be an organic layer.

The light-emitting element layer 130 may be located on the circuit layer 120. The light-emitting element layer 130 may include the light-emitting element 100PE. For example, the light-emitting element layer 130 may include an organic light-emitting material, a quantum dot, a quantum rod, a micro-LED, or a nano-LED. The following description will be described regarding the light-emitting element 100PE, which is an organic light-emitting device, by way of example, but the present disclosure is not specifically limited thereto.

The light-emitting element 100PE may include a first electrode AE, a light-emitting layer EML, and a second electrode CE. The first electrode AE may be located on the sixth insulating layer 60. The first electrode AE may be connected to the second connection electrode CNE2 through a third contact hole CNT-3 formed through the sixth insulating layer 60.

A pixel-defining layer 70 may be located on the sixth insulating layer 60 and may cover a portion of the first electrode AE. An opening 70-OP is defined in the pixel-defining layer 70. The opening 70-OP of the pixel-defining layer 70 exposes at least a portion of the first electrode AE.

The active region 1000A (see FIG. 1) may include a light-emitting region PXA, and a non-light-emitting region NPXA adjacent to the light-emitting region PXA. The non-light-emitting region NPXA may surround the light-emitting region PXA. The light-emitting region PXA is defined to correspond to the portion of the first electrode AE, which is exposed by the opening 70-OP.

The light-emitting layer EML may be located on the first electrode AE. The light-emitting layer EML may be located in a region defined by the opening 70-OP. In other words, the light-emitting layer EML may be separately formed in each of pixels. When the light-emitting layer EML is separately formed in each pixel, each of the light-emitting layers EML may emit light of at least one of a blue color, a red color, or a green color. However, the present disclosure is not limited thereto. For example, the light-emitting layer EML may extend throughout the pixels, and may be commonly provided. In this case, the light-emitting layer EML may provide blue light or white light.

The second electrode CE may be located on the light-emitting layer EML. The second electrode CE may be integrally located in the pixels in common. The second electrode CE may be referred to as a common electrode CE.

In one or more embodiments, a hole control layer may be interposed between the first electrode AE and the light-emitting layer EML. The hole control layer may be commonly located in the light-emitting region PXA and the non-light-emitting region NPXA. The hole control layer may include a hole transport layer, and may further include a hole injection layer. An electron control layer may be interposed between the light-emitting layer EML and the second electrode CE. The electron control layer may include an electron transport layer, and may further include an electron injection layer. The hole control layer and the electron control layer may be commonly formed in the pixels by using an open mask.

The encapsulation layer 140 may be located on the light-emitting element layer 130. The encapsulation layer 140 may include an inorganic layer, an organic layer, and an inorganic layer sequentially stacked, and layers constituting the encapsulation layer 140 are not limited thereto.

The inorganic layers may protect the light-emitting element layer 130 from moisture and oxygen, and the organic layer may protect the light-emitting element layer 130 from a foreign material, such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The input sensor 200 may be formed on the display panel 100 through subsequent processes. In this case, it may be expressed that the input sensor 200 is directly located on the display panel 100. The wording "the input sensor 200 is directly located on the display panel" indicates that no other component is located between the input sensor 200 and the display panel 100. In other words, an additional adhesive member may not be interposed between the input sensor 200 and the display panel 100. Alternatively, the input sensor 200 may be coupled to the display panel 100 through the adhesion member. The adhesion member may include a typical adhesive agent or adhesion agent.

The input sensor 200 may include a base-insulating layer 201, a first conductive layer 202, a sensing-insulating layer 203, a second conductive layer 204, and a cover-insulating layer 205.

The base-insulating layer 201 may be an inorganic layer including at least one of silicon nitride, silicon oxynitride, or silicon oxide. Alternatively, the base-insulating layer 201 may be an organic layer including epoxy resin, acrylate resin, or imide-based resin. The base-insulating layer 201 may have a single-layer structure or may have a multi-layer structure stacked in the third direction DR3.

Each of the first conductive layer 202 and the second conductive layer 204 may have a single-layer structure or a multi-layer structure stacked in the third direction DR3.

A conductive layer in the single-layer structure may include a metal layer or a transparent conductive layer. The metal layer may include molybdenum, silver, titanium, copper, aluminum, or the alloy thereof. The transparent conductive layer may include transparent conductive oxide, such as indium tin oxide (ITO), indium zinc oxide (IZO), zinc oxide (ZnO), or indium zinc tin oxide (IZTO). In addition, the transparent conductive layer may include conductive polymer, such as PEDOT, metal nanowire, or graphene.

A conductive layer in the multi-layer structure may include metal layers. The metal layers may, for example, have a three-layer structure of titanium/aluminum/titanium. The conductive layer in the multi-layer structure may include at least one metal layer and at least one transparent conductive layer.

At least one of the sensing-insulating layer 203 or the cover-insulating layer 205 may include an inorganic film. The inorganic film may include at least one of an aluminum oxide, a titanium oxide, a silicon oxide, a silicon nitride, a silicon oxynitride, a zirconium oxide, or hafnium oxide.

At least one of the sensing-insulating layer 203 or the cover-insulating layer 205 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

Figure 4:
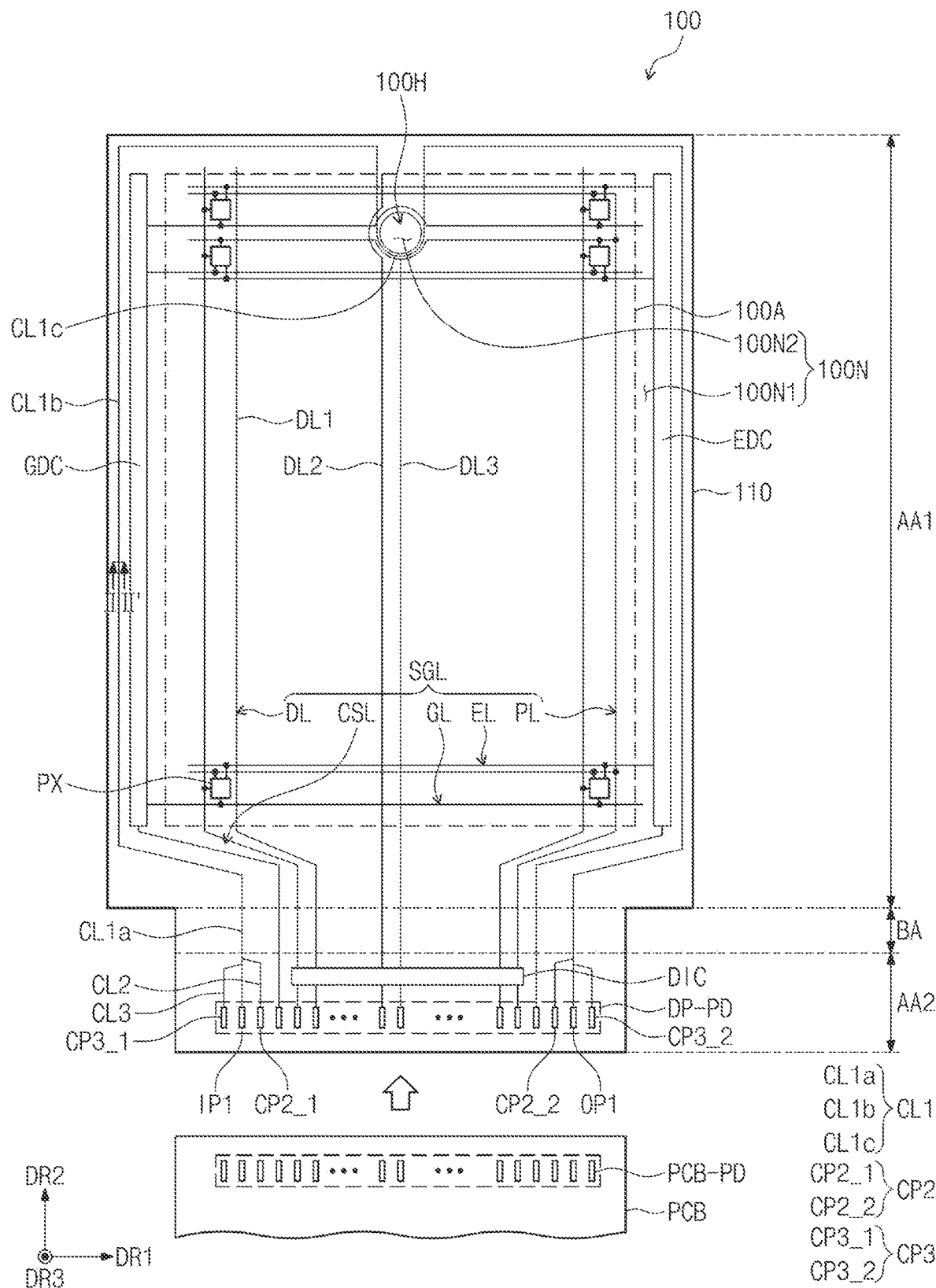
FIG. 4 is a plan view of a display panel, according to one or more embodiments of the present disclosure.

FIG. 4 is a plan view of a display panel, according to one or more embodiments of the present disclosure.

Referring to FIG. 4, the display panel 100 may include an active region 100A, and a peripheral region 100N adjacent to the active region 100A. The active region 100A may be a region for displaying an image. The active region 100A may have a plurality of pixels PX located therein. The peripheral region 100N may include a first peripheral region 100N1 and a second peripheral region 100N2. The first peripheral region 100N1 may surround the active region 100A. A driving circuit or a driving line may be located in the first peripheral region 100N1. The active region 100A may surround the second peripheral region 100N2. The second peripheral region 100N2 may have a pattern hole 100H defined therein. A light signal may travel through the second peripheral region 100N2. The second peripheral region 100N2 may have light transmittance that is higher than the active region 100A.

When viewed in a plan view, the active region 100A may overlap the active region 1000A (see FIG. 1) of the display device 1000 (see FIG. 1), and the first peripheral region 100N1 may overlap the peripheral region 1000N (see FIG. 1) of the display device 1000. The second peripheral region 100N2 may overlap the hole region 1000H (see FIG. 1) of the display device 1000.

Although FIG. 4 illustrates that the hole region 1000H corresponds to the second peripheral region 100N2 on which the image is not displayed, the present disclosure is not limited thereto. The hole region 1000H may correspond to a transmissive active region for substantially displaying an image and having the pattern hole 100H defined therein. In this case, the transmissive active region may be surrounded by a normal active region (e.g., corresponding to the active region 100A), and may have a light transmittance that is higher than that of the normal active region. According to one or more embodiments of the present disclosure, the transmissive active region may have pixels PX located at a density lower than that of pixels PX in the normal active region.

The display panel 100 may include the base layer 110, a plurality of pixels PX, a plurality of signal lines SGL, a scanning driver GDC, a data driver DIC, and a light-emitting driver EDC.

The display panel 100 may be a flexible display panel. For example, the display panel 100 may include a plurality of electronic devices located on the base layer 110. The display panel 100 may extend lengthwise in the second direction DR2. The display panel 100 may have a plane defined by the first direction DR1 and the second direction DR2.

The display panel 100 may include a first region AA1, a second region AA2, and a bending region BA interposed between the first region AA1 and the second region AA2. The bending region BA may extend in the first direction DR1. The first region AA1, the bending region BA, and the second region AA2 may be arranged in the second direction DR2. The bending region BA may be bent toward the rear surface of the base layer 110. In this case, the first region AA1 and the second region AA2 may face each other.

The first region AA1 may extend in the second direction DR2, and may have longer sides spaced apart from each other in the first direction DR1. The widths of the bending region BA and the second region AA2 may be shorter than the width of the first region AA1 with respect to the first direction DR1.

The first region AA1 may include the active region 100A, the first peripheral region 100N1 around the active region 1000A, and the second peripheral region 100N2. The second region AA2 and the bending region BA may be regions in which an image is not displayed.

The plurality of pixels PX may be located in the active region 100A. Each of the plurality of pixels PX may display one of primary colors or one of mixed colors. The primary color may include red, green, or blue. The mixed color may include various colors, such as white, yellow, cyan, or magenta. However, the color displayed by each of the pixels PX is not limited thereto.

The plurality of signal lines SGL may be located on the base layer 110. The plurality of signal lines SGL may be connected to the plurality of pixels PX to transmit an electrical signal to the plurality of pixels PX. The plurality of signal lines SGL may not overlap the second peripheral region 100N2. For example, ones of the signal lines SGL that are adjacent to the second peripheral region 100N2 may be located along an outer portion of the second peripheral region 100N2.

The plurality of signal lines SGL may include scanning lines GL, data lines DL, a power line PL, a control signal line CSL, and light-emitting lines EL. The plurality of signal lines SGL according to one or more embodiments of the present disclosure may further include separate reset lines.

The scanning lines GL may be connected to relevant pixels PX of the pixels PX, respectively. The data lines DL may be connected to relevant pixels PX of the pixels PX, respectively. The power line PL may be commonly connected to the pixels PX. The light-emitting lines EL may be connected to relevant ones of the pixels PX, respectively. The control signal line CSL may provide control signals to the scanning driver GDC.

The scanning driver GDC, the data driver DIC, and the light-emitting driver EDC may be located in the peripheral region 100N. The scanning driver GDC and the light-emitting driver EDC may be located in the peripheral region 100N adjacent to longer sides of the first region AA1. The data driver DIC may be located in the second region AA2. The data driver DIC may be referred to as a driving integrated circuit or a driving chip.

The data driver DIC may be mounted in the second region AA2. The data driver DIC may be a control circuit in the form of a chip. However, this is provided only for the illustrative purpose. The data driver DIC according to one or more embodiments of the present disclosure may be mounted on a film separate from the display panel 100. In this case, the data driver DIC may be electrically connected to a plurality of pads DP-PD through the film.

The scanning lines GL may extend in the first direction DR1 to be connected to the scanning driver GDC. The scanning driver GDC may generate a plurality of scanning signals in response to the scan control signal. The scanning signals may be applied to the plurality of pixels PX through the scanning lines GL. The plurality of scanning signals may be sequentially applied to the plurality of pixels PX.

The data lines DL may extend in the second direction DR2 and may be connected to the data driver DIC through the bending region BA. The data driver DIC may generate a plurality of data voltages corresponding to image signals in response to the data control signal. The plurality of data voltages may be applied to the plurality of pixels PX through the data lines DL.

The light-emitting lines EL may extend in the first direction DR1 to be connected to the light-emitting driver EDC. The power line PL may extend in the second direction DR2 and may be located in the peripheral region 100N. The light-emitting driver EDC may generate a plurality of light-emitting signals in response to the light-emitting control signal. The plurality of light-emitting signals may be applied to the plurality of pixels PX through the scanning lines GL.

When viewed in a plan view, the plurality of pads DP-PD may be located to be adjacent to a lower portion of the second region AA2. The data lines DL, the power line PL, and the control signal line CSL may be connected to the plurality of pads DP-PD.

The display panel 100 may further include a first crack line CL1, a second crack line CL2, and a third crack line CL3. The first crack line CL1, the second crack line CL2, and the third crack line CL3 may detect a defect, such as a scratch and/or a crack, caused in the outermost region of the display panel 100. The plurality of pads DP-PD may further include pads (hereinafter, referred to as an input pad IP1 and an output pad OP1) connected to opposite ends of the first crack line CL1, pads (hereinafter, referred to as first connection pads CP2) connected to opposite ends of the second crack line CL2, and pads (hereinafter, second connection pads CP3) connected to opposite ends of the third crack line CL3.

The first crack line CL1 may be located in the first peripheral region 100N1. When viewed in a plan view, a portion of the first crack line CL1 may surround at least a portion of the active region 100A. Another portion of the first crack line CL1 may surround at least a portion of the pattern hole 100H. The first crack line CL1 may include a first part CL1a, a second part CL1b, and a third part CL1c.

The first part CL1a may extend in the second direction DR2. The first part CL1a may be located in the second region AA2 and the bending region BA. A first end of the first part CL1a may be connected to the input pad IP1 or the output pad OP1. A second end of the first part CL1a may be connected to the second part CL1b.

The second part CL1b may extend in the second direction DR2. The second part CL1b may be located in the first region AA1. The second part CL1b may be located along an outer portion of the display panel 100. The second part CL1b may be located at the outside of components including the scanning driver GDC, the light-emitting driver EDC, and the power line PL. A first end of the second part CL1b may be connected to the second end of the first part CL1a, and a second end of the second part CL1b may be connected to the third part CL1c.

A portion of the third part CL1c may be located in the first peripheral region 100N1, and may extend in the first direction DR1. Another portion of the third part CL1c may surround at least a portion of the pattern hole 100H.

The second and third crack lines CL2 and CL3 may be located in the first peripheral region 100N1. When viewed in a plan view, portions of the second and third crack lines CL2 and CL3 may surround at least a portion of the active region 100A. Another portion of the second and third crack lines CL2 and CL3 may surround at least a portion of the pattern hole 100H.

The second crack line CL2 may be located under the first crack line CL1, and the third crack line CL3 may be located above the first crack line CL1. The area of the first peripheral region 100N1 may be increased, when a plurality of lines are located instead of one line to inspect the defect of the display device 1000 (see FIG. 1). However, according to the present disclosure, the second crack line CL2 and the third crack line CL3 may be located under and above the first crack line CL1, respectively, to overlap the first crack line CL1. The first crack line CL1, the second crack line CL2, and the third crack line CL3 may be provided in a region corresponding to the width of one crack line, when viewed in a plan view. Accordingly, even if the number of crack lines is increased, the area of the first peripheral region 100N1 (in plan view) may not be increased. Accordingly, the display device 1000 including the peripheral region 1000N (see FIG. 1) having a reduced area may be provided.

When viewed in a plan view, the first to third crack lines CL1, CL2, and CL3 may overlap each other in the first region AA1 and the bending region BA. The first to third crack lines CL1, CL2, and CL3 may be partially overlapped with the second region AA2. The end portions of the second crack line CL2 are connected to the first connection pad CP2, and the end portions of the third crack line CL3 are connected to the second connection pad CP3. According to one or more embodiments of the present disclosure, the first connection pad CP2 may include a first sub-connection pad CP2_1 connected to a first end of the second crack line CL2, and a second sub-connection pad CP2_2 connected to a second end of the second crack line CL2. The second connection pad CP3 may include a third sub-connection pad CP3_1 connected to a first end of the third crack line CL3, and a fourth sub-connection pad CP3_2 connected to a second end of the third crack line CL3. The input pad IP1, the output pad OP1, the first connection pad CP2, and the second connection pad CP3 may be located in the second region AA2.

The display device 1000 may further include a circuit board PCB electrically connected to the display panel 100. The circuit board PCB may be a rigid circuit board or a flexible circuit board.

A timing control circuit to control an operation of the display panel 100 may be located on the circuit board PCB. In addition, a sensor control circuit to control the input sensor 200 (see FIG. 2B) may be located on the circuit board PCB. Each of the timing control circuit and the sensor control circuit may be mounted in the form of a chip on the circuit board PCB. However, this is provided only for the illustrative purpose. According to one or more embodiments of the present disclosure, the timing control circuit and the sensor control circuit may be integrated in the form of one chip and mounted on the circuit board PCB.

The circuit board PCB may include a plurality of circuit pads PCB-PD electrically connected to the plurality of pads DP-PD of the display panel 100. In one or more embodiments, the circuit board PCB may further include signal lines connecting a plurality of circuit pads PCB-PD to a timing control circuit and/or a sensor control circuit.

Figure 5A:
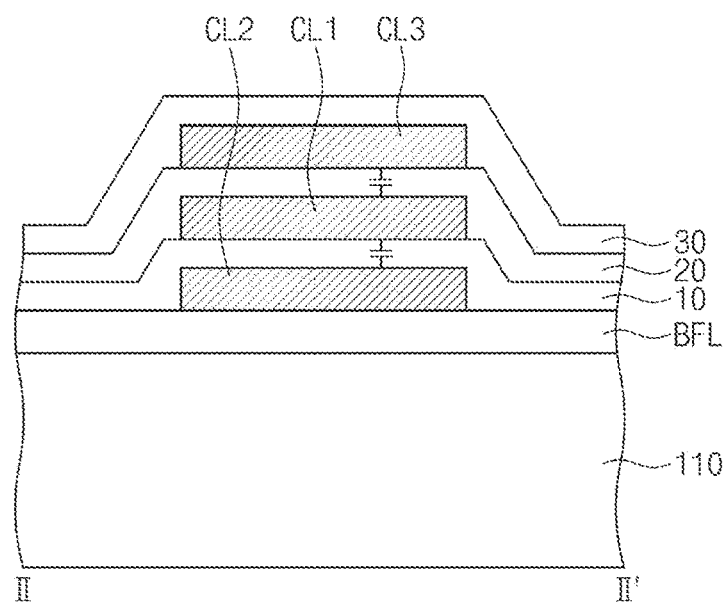
FIG. 5A is a partially cross-sectional view of a display panel taken along the line II-II' of FIG. 4.
Figure 5A:
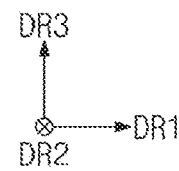
Figure 5B:
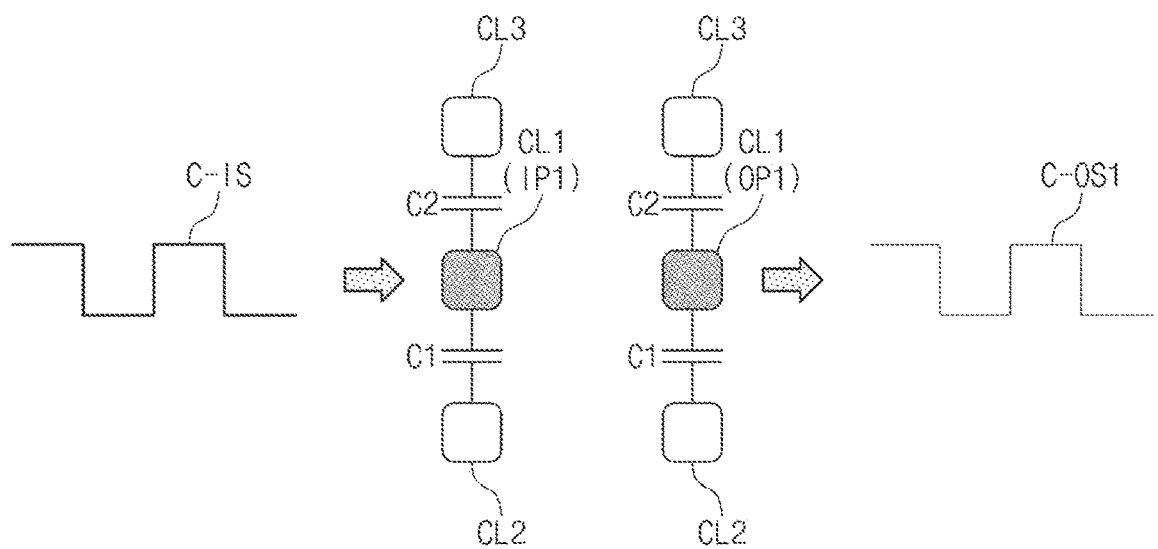
FIG. 5B is a waveform illustrating an input signal and an output signal in a normal state of a display panel, according to one or more embodiments of the present disclosure.

FIG. 5A is a partial sectional view of a display panel taken along the line II-II' of FIG. 4, and FIG. 5B is a waveform illustrating an input signal and an output signal in a normal state of a display panel, according to one or more embodiments of the present disclosure. In the following description made with reference to FIG. 5A, components the same as the components that are described with reference to FIG. 3 are assigned with the same reference numerals, and the details thereof will be omitted.

Referring to FIGS. 5A and 5B, the buffer layer BFL may be located on the base layer 110. The second crack line CL2 may be located on the buffer layer BFL. The first insulating layer 10 may be located on the buffer layer BFL and the second crack line CL2.

The first crack line CL1 may be located on the first insulating layer 10. In other words, the first insulating layer 10 may be interposed between the first crack line CL1 and the second crack line CL2. The first crack line CL1 and the second crack line CL2 may be insulated from each other due to the first insulating layer 10. The second insulating layer 20 may be located on the first insulating layer 10 and the first crack line CL1.

The third crack line CL3 may be located on the second insulating layer 20. In other words, the second insulating layer 20 may be interposed between the first crack line CL1 and the third crack line CL3. The first crack line CL1 and the third crack line CL3 may be insulated from each other due to the second insulating layer 20. The third insulating layer 30 may be located on the second insulating layer 20 and the third crack line CL3.

At least one of the first to third crack lines CL1, CL2, and CL3 may be located on the same layer as the transistor 100PC (see FIG. 3). However, this is provided only for the illustrative purpose. The positions of the first to third crack lines CL1, CL2, and CL3 are not limited thereto. At least one of the first to third crack lines CL1, CL2, and CL3 may be formed through the same process as the transistor 100PC, and may include the same material as the transistor 100PC.

The second insulating layer 20 may be located on the first crack line CL1, the first insulating layer 10 may be located on the second crack line CL2, and the third insulating layer 30 may be located on the third crack line CL3. However, this is provided only for the illustrative purpose. The arrangement relationship between the first to third crack lines CL1, CL2, and CL3 are not limited thereto. For example, the second crack line CL2 may be located on the first insulating layer 10, the second insulating layer 20 may be interposed between the first crack line CL1 and the second crack line CL2, and the third insulating layer 30 may be interposed between the first crack line CL1 and the third crack line CL3.

When viewed in a plan view, the first to third crack lines CL1, CL2, and CL3 may overlap each other. As the first crack line CL1, the second crack line CL2, and third crack line CL3 may completely overlap each other, the first to third crack lines CL1, CL2, and CL3 may be provided in a region corresponding to a width of one of the first to third crack lines CL1, CL2, and CL3.

According to one or more embodiments of the present disclosure, the display device 1000 (see FIG. 1) may inspect the defect in a first inspection mode or a second inspection mode. In the first inspection mode, the display device 1000 may detect a crack using the first to third crack lines CL1, CL2, and CL3, and may detect a crack using two crack lines of the first to third crack lines CL1, CL2, and CL3 in the second inspection mode.

In the first inspection mode, an input signal C-IS may be supplied to the input pad IP1, and an output signal C-OS1 may be output from the output pad OP1. The input signal C-IS may be an alternating current (AC) signal that swings between a first voltage level and a second voltage level, which is higher than the first voltage level. In the first inspection mode, a first direct current (DC) voltage having the first voltage level is applied to the first connection pad CP2 (see FIG. 4), and a second DC voltage having the second voltage level is applied to the second connection pad CP3 (see FIG. 4).

A first capacitor C1 is formed between the first crack line CL1 and the second crack line CL2, and a second capacitor C2 is formed between the first crack line CL1 and the third crack line CL3.

When the first to third crack lines CL1, CL2, and CL3, are not defective, an output signal (hereinafter, a normal output signal C-OS1) may be output from the output pad OP1 without distortion. In other words, the normal output signal C-OS1 may have the same waveform as the input signal C-IS. For example, the normal output signal C-OS1 may have the same amplitude as the input signal C-IS, and may have the same phase as the input signal C-IS.

Figure 6A:
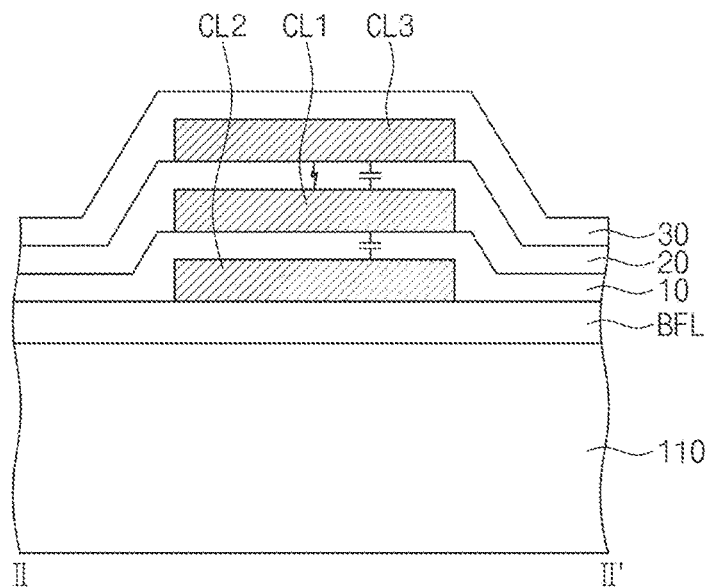
FIG. 6A is a cross-sectional view illustrating that a third crack line of a display panel is defective, according to one or more embodiments of the present disclosure.
Figure 6A:
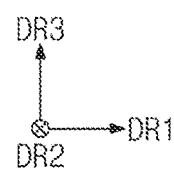
Figure 6B:
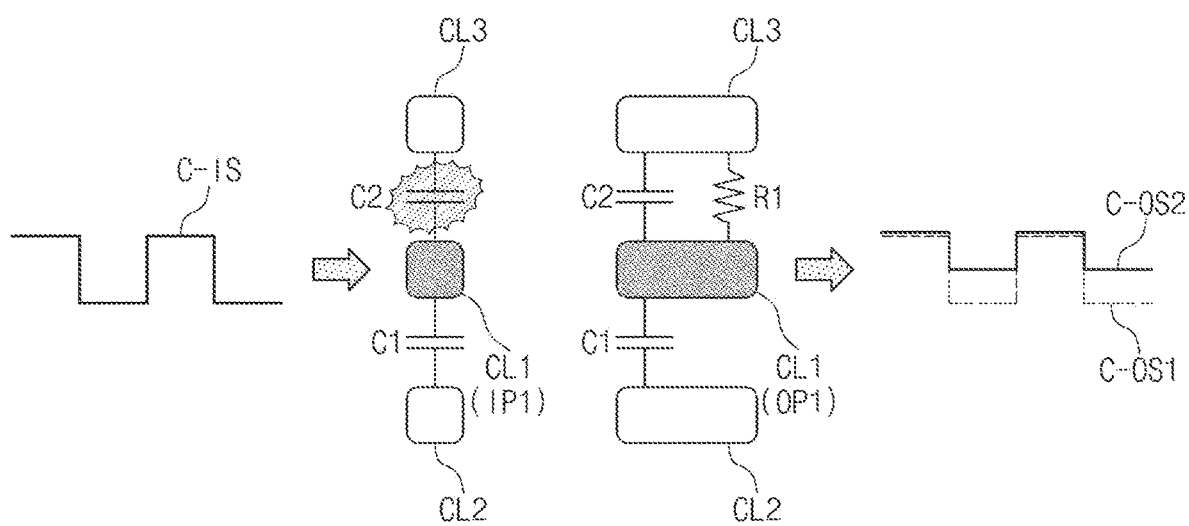
FIG. 6B is a waveform illustrating an input signal and an output signal in the state that an upper portion of the display panel is defective, according to one or more embodiments of the present disclosure.
Figure 7A:
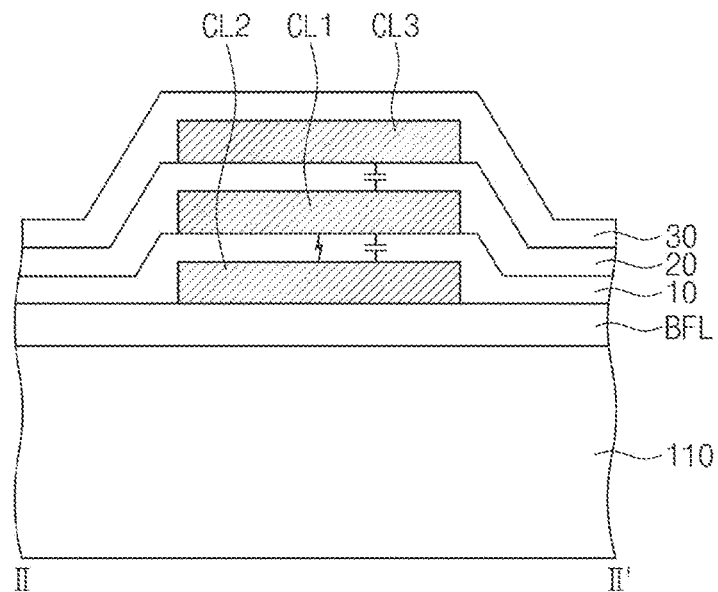
FIG. 7A is a partial sectional-view illustrating that a second crack line of the display panel is defective, according to one or more embodiments of the present disclosure.
Figure 7A:
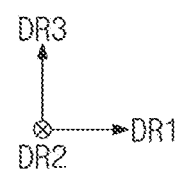
Figure 7B:
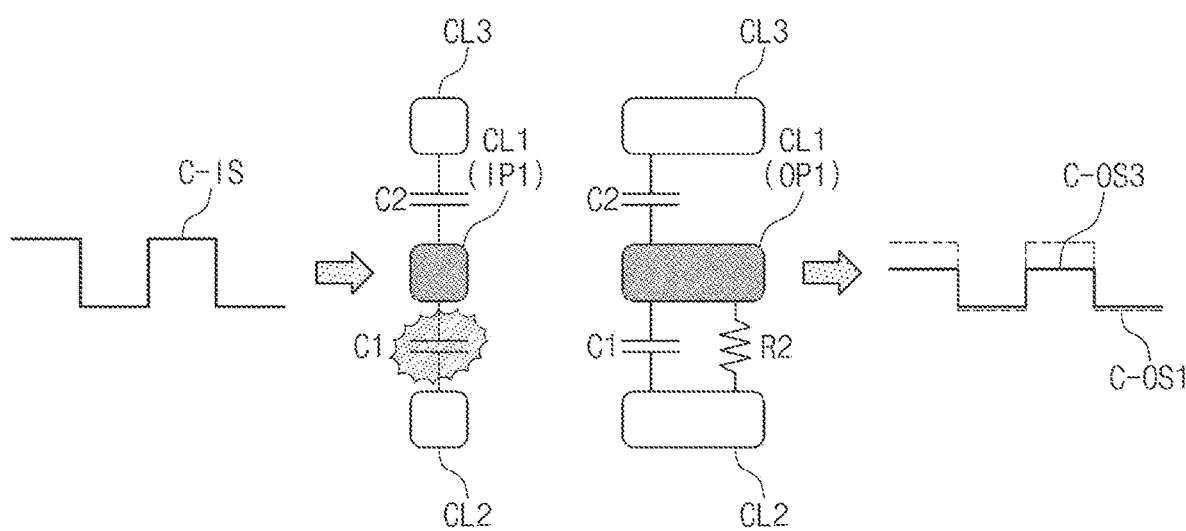
FIG. 7B is a waveform illustrating an input signal and an output signal in the state that a lower portion of the display panel is defective, according to one or more embodiments of the present disclosure.
Figure 8A:
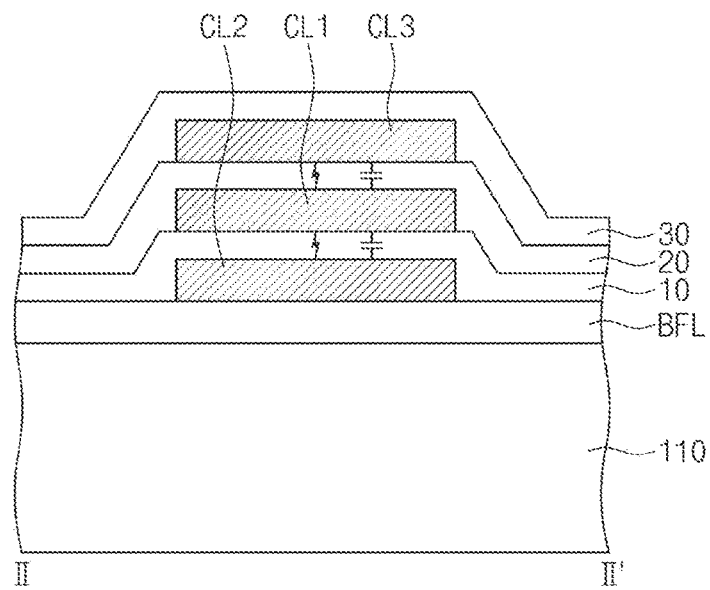
FIG. 8A is a partial sectional-view illustrating that a second crack line and a third crack line of a display panel are defective, according to one or more embodiments of the present disclosure.
Figure 8A:
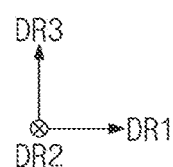

FIG. 6A is a partial sectional-view illustrating that a third crack line of a display panel is defective, according to one or more embodiments of the present disclosure, and FIG. 6B is a waveform illustrating an input signal and an output signal in the state that an upper portion of the display panel is defective (e.g., an upper defect state), according to one or more embodiments of the present disclosure. FIG. 7A is a partial sectional-view illustrating that a second crack line of the display panel is defective, according to one or more embodiments of the present disclosure, and FIG. 7B is a waveform illustrating an input signal and an output signal in the state that a lower portion of the display panel is defective (e.g., a lower defect state), according to one or more embodiments of the present disclosure. FIG. 8A is a partial sectional-view illustrating that a second crack line and a third crack line of the display panel are defective, according to one or more embodiments of the present disclosure, and FIG. 8B is a waveform illustrating an input signal and an output signal in the state that an upper portion and a lower portion of the display panel are defective (e.g., an upper-lower defect state), according to one or more embodiments of the present disclosure.

Referring to FIGS. 6A and 6B, the third crack line CL3 of the first to third crack lines CL1, CL2, and CL3 may be defective (e.g., the upper defect). When the third crack line CL3 is defective, a resistor component R1 may be further formed between the first crack line CL1 and the third crack line CL3. Accordingly, when the third crack line CL3 is defective, the output signal (hereinafter, a first abnormal output signal C-OS2) output from the output pad OP1 may have a distorted form different from that of the input signal IS. For example, the first abnormal output signal C-OS2 may be a signal shifted from the normal output signal C-OS1 toward the second voltage level. In addition, the first abnormal output signal C-OS2 may have an amplitude that is less than that of the normal output signal C-051.

Referring to FIGS. 7A and 7B, the second crack line CL2 of the first to third crack lines CL1, CL2, and CL3 may be defective (e.g., the lower defect). When the second crack line CL2 is defective, a resistor component R2 may be further formed between the first crack line CL1 and the second crack line CL2. Accordingly, when the second crack line CL2 is defective, the output signal (hereinafter, a second abnormal output signal C-OS3) output from the output pad OP1 may have a distorted form different from that of the input signal C-IS. For example, the second abnormal output signal C-OS3 may be a signal shifted from the normal output signal C-OS1 toward the first voltage level. In addition, the second abnormal output signal C-OS3 may have an amplitude that is less than that of the normal output signal C-051.

Figure 8B:
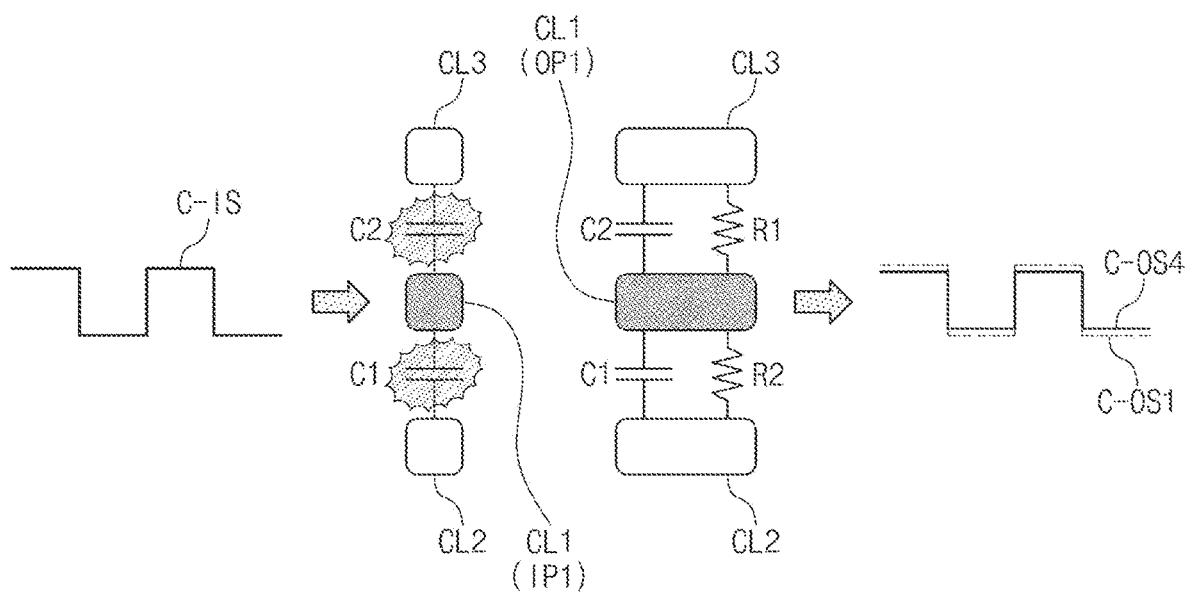
FIG. 8B is a waveform illustrating an input signal and an output signal in the state that an upper portion and a lower portion of the display panel are defective, according to one or more embodiments of the present disclosure.

Referring to FIGS. 8A and 8B, the second crack line CL2 and the third crack line CL3 of the first to third crack lines CL1, CL2, and CL3 may be concurrently or substantially simultaneously defective (e.g., the upper-lower defect). When the second crack line CL2 and the third crack line CL3 are defective, the resistor components R1 and R2 may be further formed between the first crack line CL1 and the second crack line CL2 and between the first crack line CL1 and the third crack line CL3, respectively. Accordingly, when the second crack line CL2 and the third crack line CL3 are defective, the output signal (hereinafter, a third abnormal output signal C-054) output from the output pad OP1 may have a distorted form that is different from that of the input signal C-IS. In addition, the third abnormal output signal C-054 may have an amplitude that is less than that of the normal output signal C-051. In other words, the third abnormal output signal C-054 may swing between the first abnormal voltage level that is higher than the first voltage level of the normal output signal C-051, and the second abnormal voltage level that is lower than the second voltage level of the normal output signal C-051. Accordingly, the third abnormal output signal C-054 may have an amplitude that is less than that of the normal output signal C-051.

Figure 9:
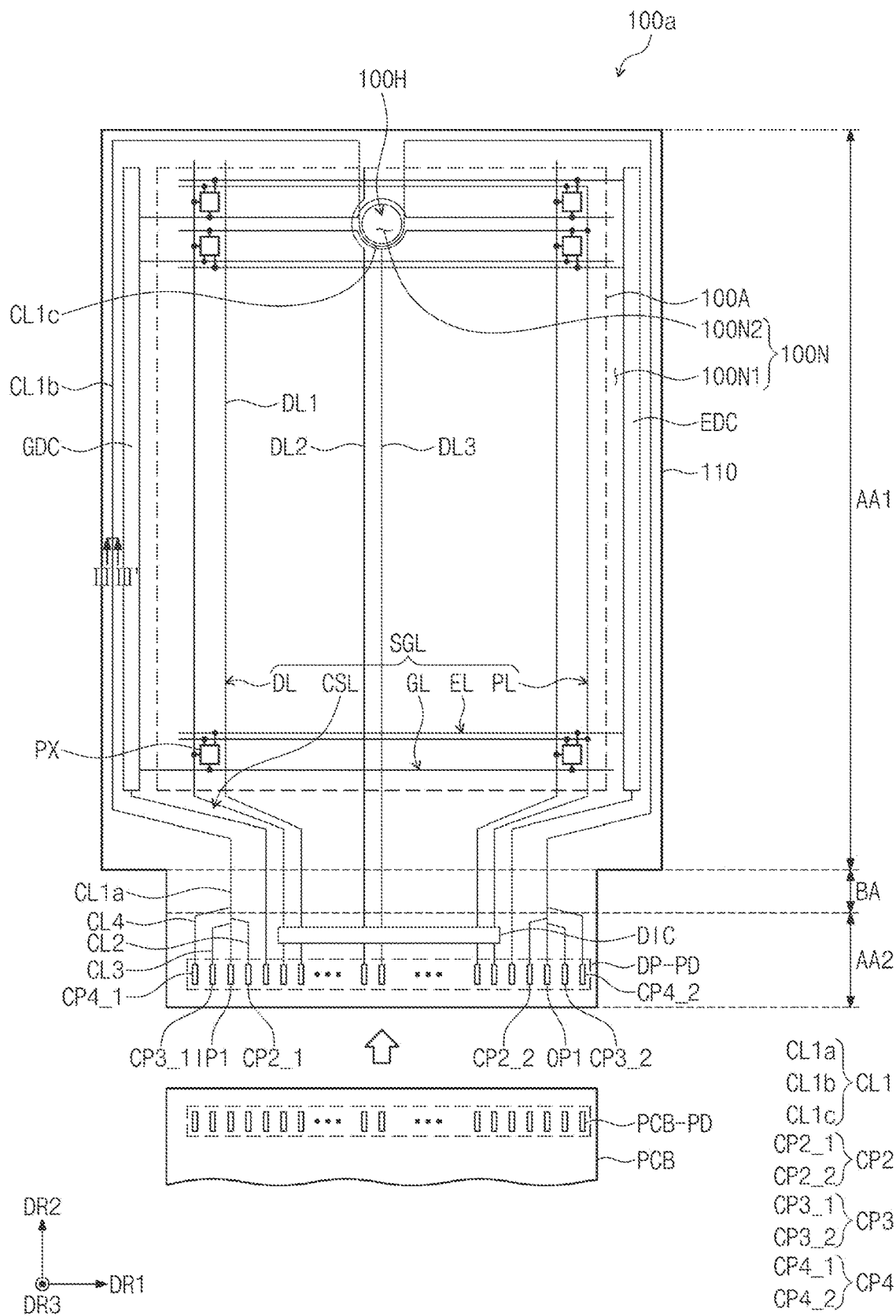
FIG. 9 is a plan view of a display panel, according to one or more embodiments of the present disclosure.
Figure 10A:
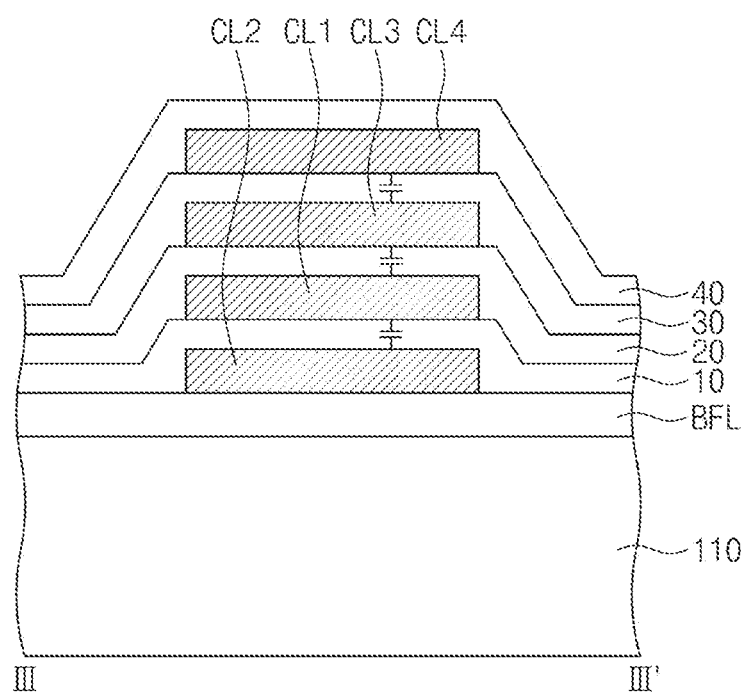
FIG. 10A is a partial sectional view of a display panel taken along the line III-III' of FIG. 9.
Figure 10B:
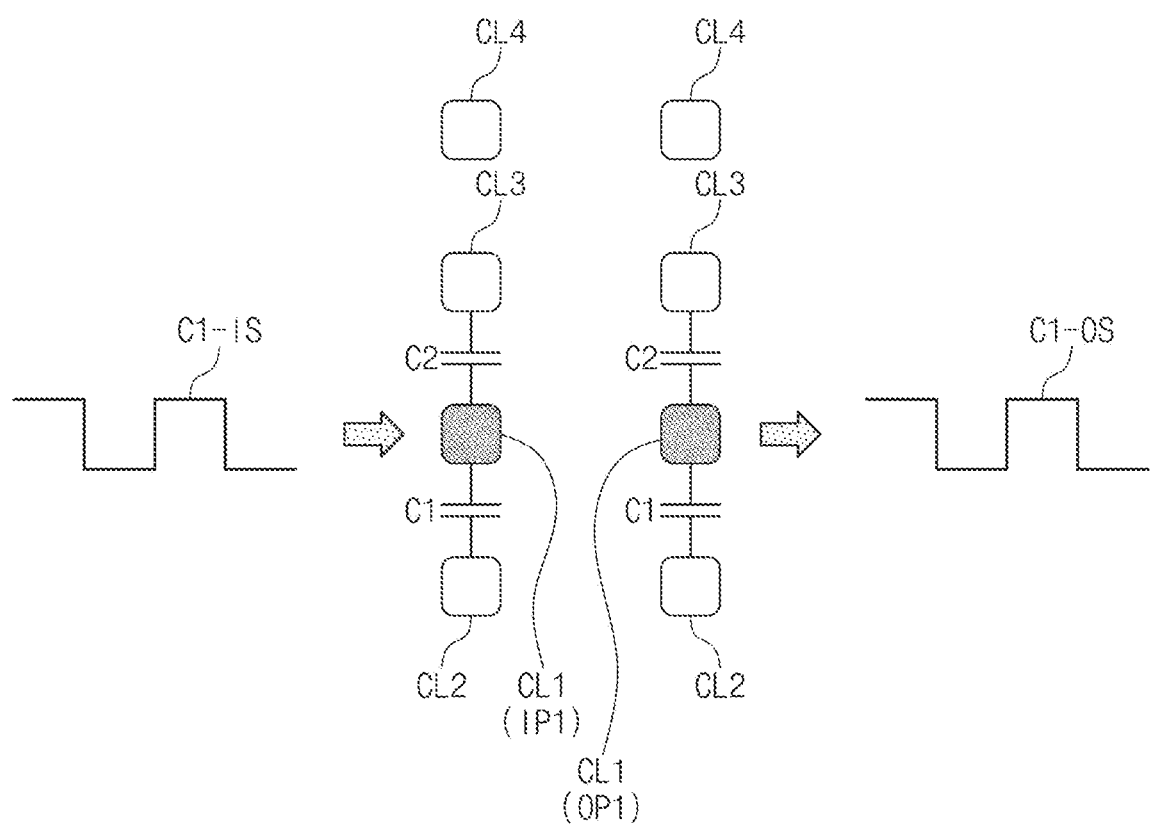
FIGS. 10B and 10C are waveforms illustrating operations of a first crack line to a fourth crack line, according to one or more embodiments of the present disclosure.
Figure 10C:
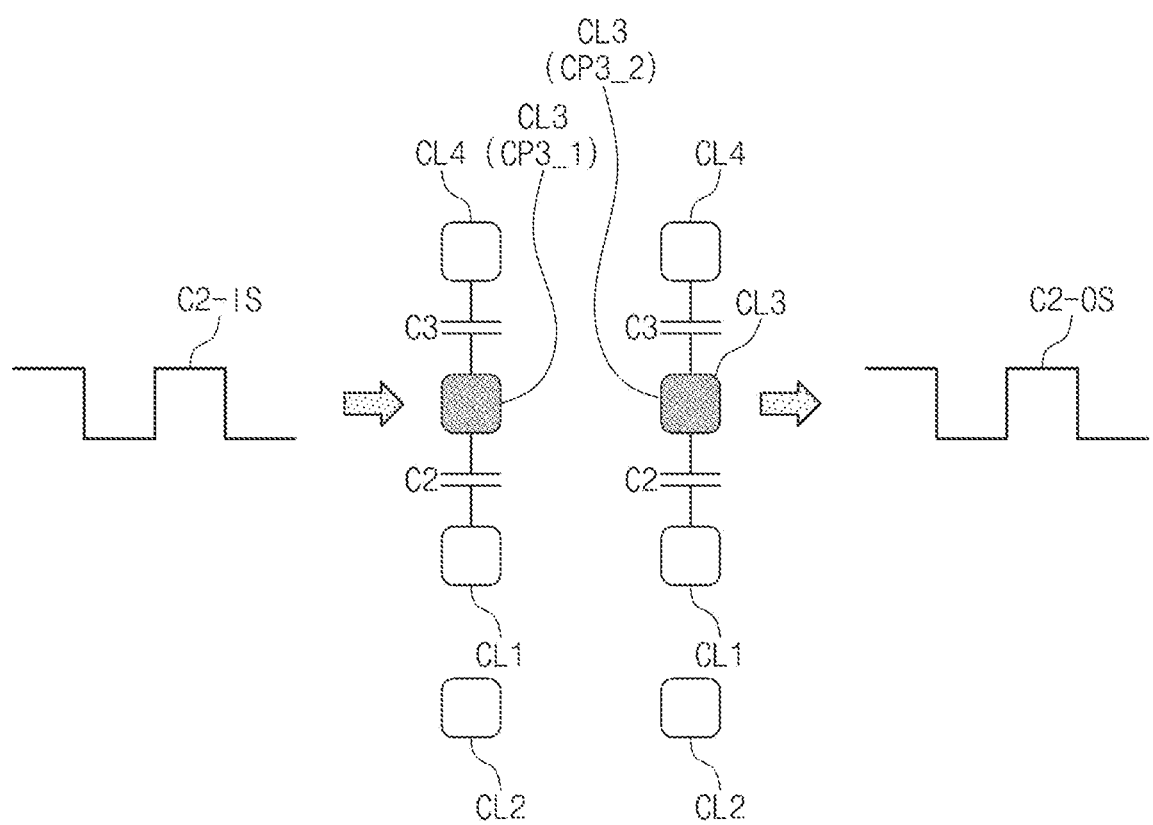
Figure 10D:
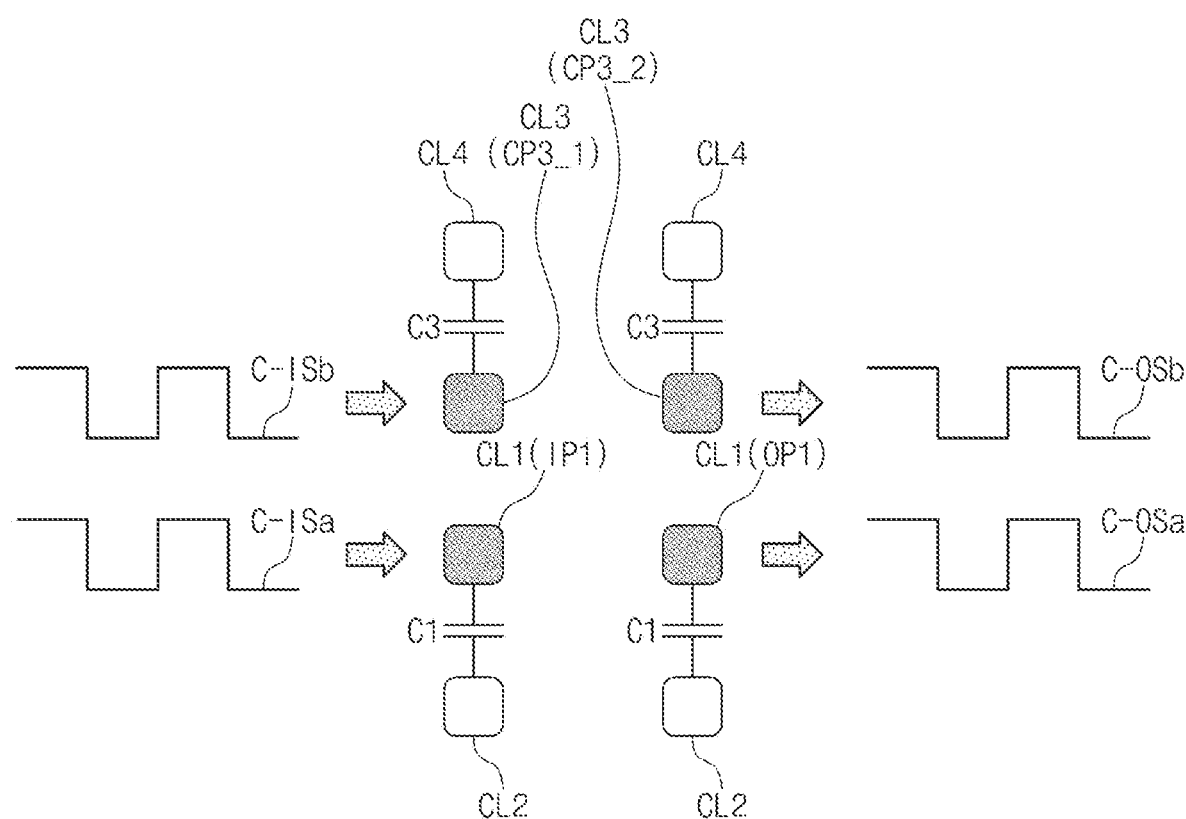
FIG. 10D is a waveform illustrating operations of a first crack line to a fourth crack line, according to one or more embodiments of the present disclosure.

FIG. 9 is a plan view of a display panel according to one or more embodiments of the present disclosure, and FIG. 10A is a partial sectional view of a display panel taken along the line III-III' of FIG. 9. FIGS. 10B and 10C are waveforms illustrating operations of a first crack line to a fourth crack line, according to one or more embodiments of the present disclosure. FIG. 10D is a waveform illustrating operations of a first crack line to a fourth crack line, according to one or more embodiments of the present disclosure. In the following description made with reference to FIG. 9, components that are the same as the components that are described with reference to FIG. 4 are assigned with the same reference numerals, and repeated details thereof will be omitted.

Referring to FIG. 9, a display panel 100a may include a first crack line CL1, a second crack line CL2, a third crack line CL3, and a fourth crack line CL4. The first crack line CL1, the second crack line CL2, the third crack line CL3, and the fourth crack line CL4 may detect a defect, such as a scratch and/or a crack, caused in the outermost region of the display panel 100a. The display panel 100a may further include the plurality of pads DP-PD including other pads (hereinafter, referred to as a third connection pad CP4) connected to respective ends of the fourth crack line CL4.

The second crack line CL2, the third crack line CL3, and the fourth crack line CL4 may be located around the first peripheral region 100N1. When viewed in a plan view, portions of the second crack line CL2, the third crack line CL3, and the fourth crack line CL4 may surround at least a portion of the active region 100A. Different portions of the second crack line CL2, the third crack line CL3, and the fourth crack line CL4 may surround at least a portion of the pattern hole 100H.

The second crack line CL2 may be located under the first crack line CL1, the third crack line CL3 may be located above the first crack line CL1, and the fourth crack line CL4 may be located above the third crack line CL3. When a plurality of crack lines are located instead of one crack line to inspect the defect of the display device 1000 (see FIG. 1), the area of the first peripheral region 100N1 may be increased. However, according to the present disclosure, the second crack line CL2, the third crack line CL3, and the fourth crack line CL4 may be located under or above the first crack line CL1, respectively, such that the second crack line CL2, the third crack line CL3, and the fourth crack line CL4 are overlapped with each other. The first crack line CL1, the second crack line CL2, the third crack line CL3, and the fourth crack line CL4 may be provided in a region corresponding to the width of one crack line, when viewed in a plan view. Accordingly, even if the number of crack lines is increased, the area of the first peripheral region 100N1 need not be increased (e.g., in plan view). Accordingly, the display device 1000 including the peripheral region 1000N (see FIG. 1) having a reduced area may be provided.

When viewed in a plan view, the first crack line CL1, the second crack line CL2, the third crack line CL3, and the fourth crack line CL4 may overlap the first region AA1 and the bending region BA. The first crack line CL1, the second crack line CL2, the third crack line CL3, and the fourth crack line CL4 may be partially overlapped with the second region AA2. End portions of the second crack line CL2 are connected to the first connection pad CP2, end portions of the third crack line CL3 are connected to the second connection pad CP3, and end portions of the fourth crack line CL4 are connected to the third connection pad CP4. According to one or more embodiments of the present disclosure, the third connection pad CP4 may include a fifth sub-connection pad CP4_1 connected to a first end of the fourth crack line CL4, and a sixth sub-connection pad CP4_2 connected to a second end of the fourth crack line CL4. The input pad IP1, the output pad OP1, the first connection pad CP2, the second connection pad CP3, and the third connection pad CP4 may be located in the second region AA2.

Referring to FIG. 10A, the buffer layer BFL may be located on the base layer 110. The second crack line CL2 may be located on the buffer layer BFL. The first insulating layer 10 may be located on the buffer layer BFL and the second crack line CL2.

The first crack line CL1 may be located on the first insulating layer 10. In other words, the first insulating layer 10 may be interposed between the first crack line CL1 and the second crack line CL2, and the first crack line CL1 and the second crack line CL2 may be insulated from each other by the first insulating layer 10.

The second insulating layer 20 may be located on the first insulating layer 10 and the first crack line CL1. The third crack line CL3 may be located on the second insulating layer 20. In other words, the second insulating layer 20 may be interposed between the first crack line CL1 and the third crack line CL3, and the first crack line CL1 and the third crack line CL3 may be insulated from each other by the second insulating layer 20.

The third insulating layer 30 may be located on the second insulating layer and the third crack line CL3. The fourth crack line CL4 may be located on the third insulating layer 30. In other words, the third insulating layer 30 may be interposed between the third crack line CL3 and the fourth crack line CL4, and the third crack line CL3 and the fourth crack line CL4 may be insulated from each other by the third insulating layer 30. The fourth insulating layer 40 may be located on the third insulating layer 30 and the fourth crack line CL4.

At least one of the first to fourth crack lines CL1, CL2, CL3, and CL4, may be located on the same layer as the transistor 100PC (see FIG. 3). However, this is provided only for the illustrative purpose. The positions of the first to fourth crack lines CL1, CL2, CL3, and CL4 are not limited thereto. At least one of the first to fourth crack lines CL1, CL2, CL3, and CL4 may be formed through the same process as the transistor 100PC, and may include the same material as the transistor 100PC.

When viewed in a plan view, the first to fourth crack lines CL1, CL2, CL3, and CL4 may overlap each other. As the first crack line CL1, the second crack line CL2, the third crack line CL3, and the fourth crack line CL4 may be completely overlapped with each other, the first crack line CL1, the second crack line CL2, the third crack line CL3, and the fourth crack line CL4 may be provided in a region corresponding to a width of one of the first to fourth crack lines CL1, CL2, CL3, and CL4.

According to one or more embodiments of the present disclosure, the display device 1000 (see FIG. 1) may inspect the defect in a first inspection mode or a second inspection mode. In the first inspection mode, the display device 1000 may detect a crack by using three crack lines of the first to fourth crack lines CL1, CL2, CL3, and CL4, and may detect a crack by using two crack lines of the first to fourth crack lines CL1, CL2, CL3, and CL4 in the second inspection mode.

Referring to FIGS. 10B and 10C, the first inspection mode may include a first sub-inspection mode to detect a crack by using the first crack line CL1, the second crack line CL2, and the third crack line CL3 of the first crack line CL1, the second crack line CL2, the third crack line CL3, and the fourth crack line CL4, and may include a second sub-inspection mode to detect a crack by using the first crack line CL1, the third crack line CL3, and the fourth crack line CL4 of the first crack line CL1, the second crack line CL2, the third crack line CL3, and the fourth crack line CL4. As the number of crack lines is increased, the number of sub-inspection modes included in the first inspection mode may be increased.

The first sub-inspection mode illustrated in FIG. 10B is the same as the first inspection mode illustrated in FIG. 5B. Accordingly, the details of the first sub-inspection mode will be omitted.

Referring to FIG. 10B, in the first sub-inspection mode, an input signal C1-IS may be applied to the input pad IP1, and an output signal C1-OS may be output from the output pad OP1. The input signal C1-IS may be an alternating current (AC) signal that swings between a first voltage level and a second voltage level, which is higher than the first voltage level. In the first sub-inspection mode, a first DC voltage corresponding to the first voltage level is applied to the first connection pad CP2 (see FIG. 9), and a second DC voltage corresponding to the second voltage level is applied to the second connection pad CP3 (see FIG. 9).

Referring to FIG. 10C, in the second sub-inspection mode, an input signal C2-IS may be supplied to the third sub-connection pad CP3_1 (see FIG. 9), and the output signal C2-OS may be output from the fourth sub-connection pad CP3_2 (see FIG. 9). The input signal C2-IS may be an alternating current (AC) signal that swings between a first voltage level and a second voltage level, which is higher than the first voltage level. In the second sub-inspection mode, a first DC voltage corresponding to the first voltage level is applied to the input pad IP1 and the output pad OP2 (see FIG. 9), and a second DC voltage corresponding to the second voltage level is applied to the third connection pad CP4 (see FIG. 9).

A second capacitor C2 is interposed between the first crack line CL1 and the third crack line CL3, and a third capacitor C3 is interposed between the third crack line CL3 and the fourth crack line CL4.

When the first crack line CL1, the third crack line CL3, and the fourth crack line CL4 are not defective, an output signal (hereinafter, a normal output signal C2-OS) may be output from the fourth sub-connection pad CP3_2 without distortion. In other words, the normal output signal C2-OS may have the same form as the input signal C2-IS. For example, the normal output signal C2-OS may have the same amplitude as, and the same phase as, the input signal C2-IS.

Referring to FIG. 10D, the crack may be detected by using the first to fourth crack lines CL1, CL2, CL3, and CL4 in the first inspection mode. In the first inspection mode, the input signal C-ISa may be supplied to the input pad IP1, and an output signal C-OSa may be output from the output pad OP1. The input signal C-ISa may be an alternating current (AC) signal that swings between a first voltage level and a second voltage level, which is higher than the first voltage level. In the first inspection mode, the first DC voltage corresponding to the first voltage level is applied to the first connection pad CP2 (see FIG. 9).

In the first inspection mode, an input signal C-ISb may be supplied to the third sub-connection pad CP3_1, and an output signal C-OSb may be output from the fourth sub-connection pad CP3_2. The input signal C-ISb may be an alternating current (AC) signal that swings between a first voltage level and a second voltage level, which is higher than the first voltage level. In the first inspection mode, the second DC voltage corresponding to the second voltage level is applied to the third connection pad CP4 (see FIG. 9).

A first capacitor C1 is formed between the first crack line CL1 and the second crack line CL2, and a third capacitor C3 is formed between the third crack line CL3 and the fourth crack line CL4.

When the first crack line CL1 and the second crack line CL2 are not defective, an output signal (hereinafter, the normal output signal C-OSa) may be output from the output pad OP1 without distortion. In other words, the normal output signal C-OSa may have the same form as the input signal C-ISa. For example, the normal output signal C-OSa may have the same amplitude as, and the same phase as, the input signal C-ISa.

When the third crack line CL3 and the fourth crack line CL4 are not defective, an output signal (hereinafter, a normal output signal C-OSb) may be output from the fourth sub-connection pad CP3_2 without distortion. In other words, the normal output signal C-OSb may have the same form as the input signal C-ISb. For example, the normal output signal C-OSb may have the same amplitude as, and the same phase as, the input signal C-ISb.

Figure 11A:
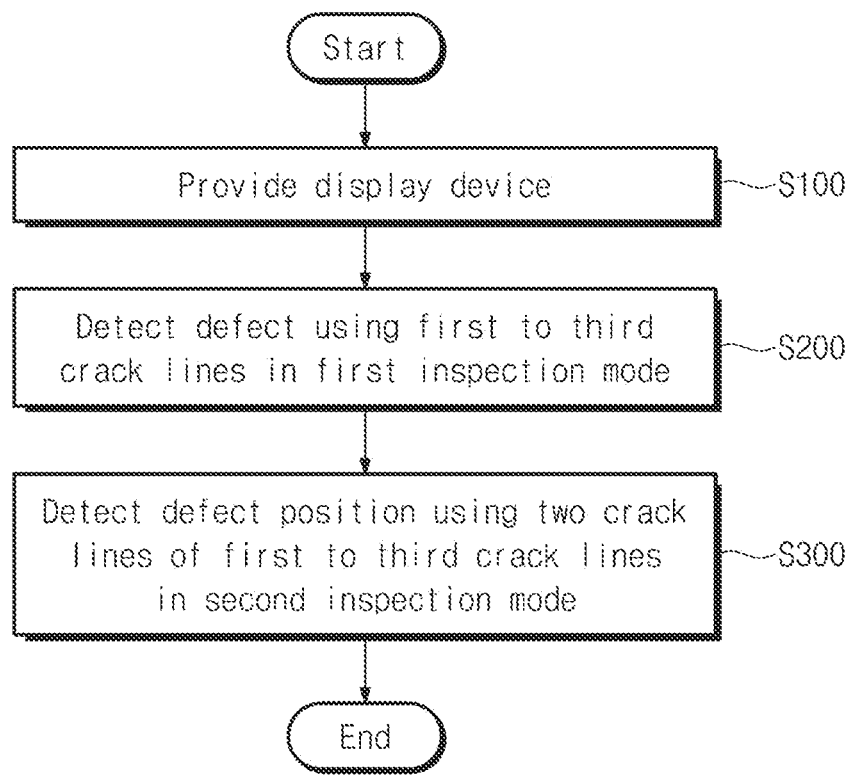
FIG. 11A is a flowchart illustrating a method for inspecting a display device, according to one or more embodiments of the present disclosure.
Figure 11B:
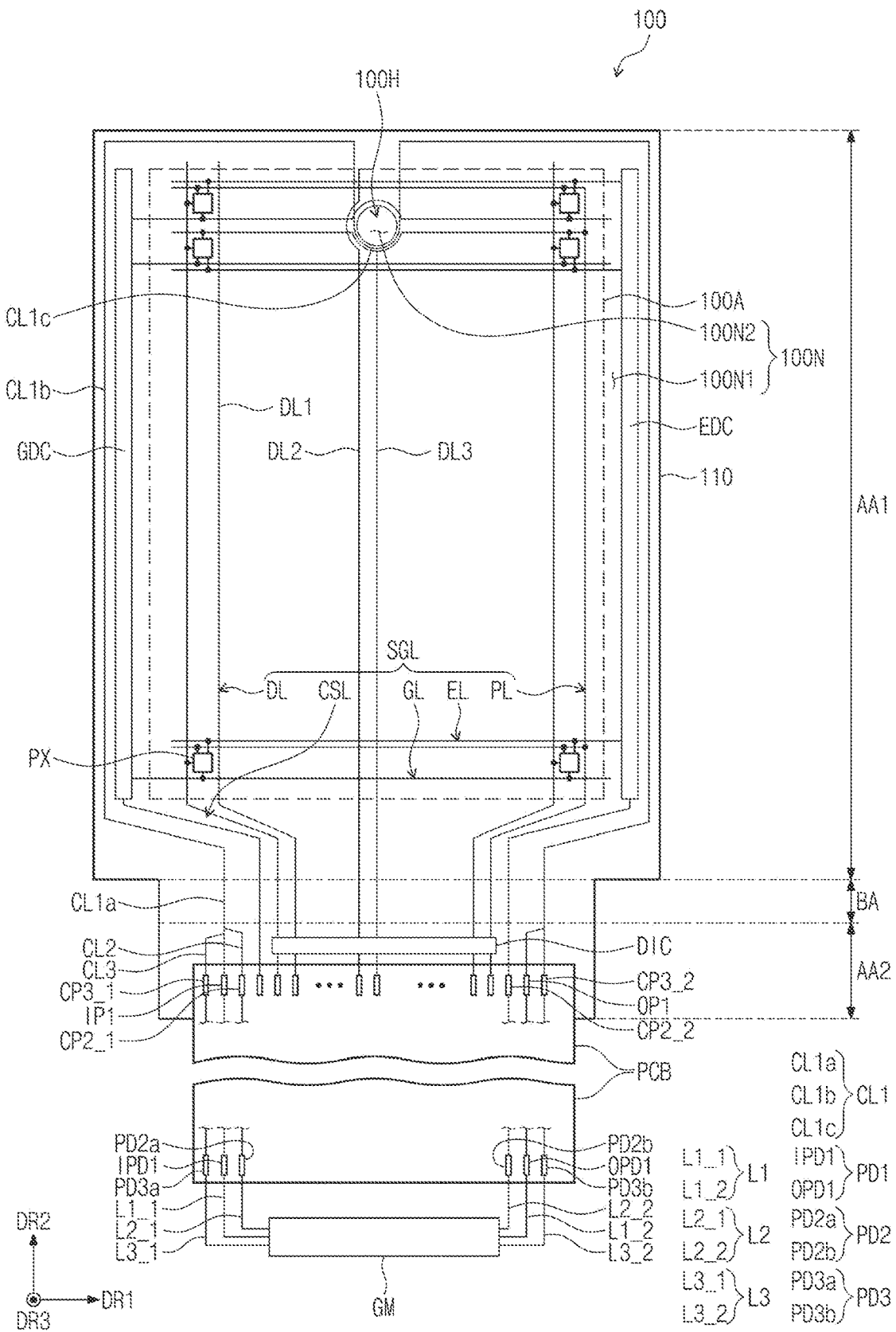
FIG. 11B is a plan view illustrating a display panel to explain a procedure of detecting a defect in a first inspection mode, according to one or more embodiments of the present disclosure.
Figure 11C:
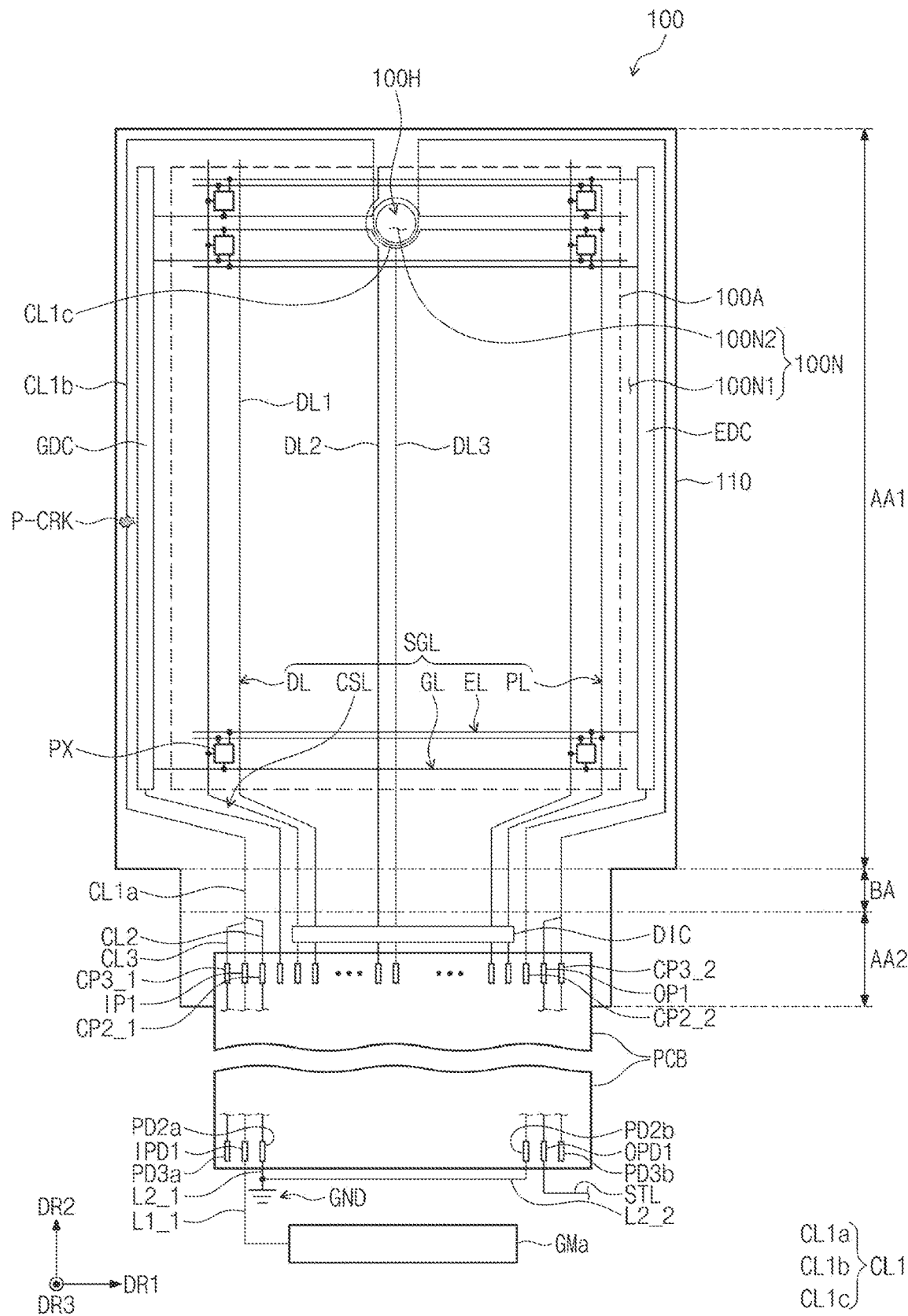
FIG. 11C is a plan view of a display panel illustrating a process of detecting a defect in a second inspection mode, according to one or more embodiments of the present disclosure.

FIG. 11A is a flowchart illustrating a method for inspecting a display device, according to one or more embodiments of the present disclosure, FIG. 11B is a plan view illustrating a display panel to explain a procedure of detecting the defect in the first inspection mode, according to one or more embodiments of the present disclosure, and FIG. 11C is a plan view of a display panel illustrating the process of detecting the defect in the second inspection mode, according to one or more embodiments of the present disclosure. In the following description made with reference to FIGS. 11B and 11C, components the same as components that are described with reference to FIG. 4 are assigned with the same reference numerals, and the details thereof will be omitted.

Referring to FIGS. 11A to 11C, the defect made in the process of manufacturing the display device 1000 (see FIG. 1) may be detected through the method for inspecting the display device 1000 (see FIG. 1), according to one or more embodiments of the present disclosure.

The display device 1000 (see FIG. 1) may be provided to be connected to a detector GM (S100). The detector GM may be electrically connected to the display device 1000 through a first detection line L1, a second detection line L2, and a third detection line L3. The first detection line L1 includes a first sub-detection line L1_1 and a second sub-detection line L1_2, and the second detection line L2 includes a third sub-detection line L2_1 and a fourth sub-detection line L2_2. The third detection line L3 includes a fifth sub-detection line L3_1 and a sixth sub-detection line L3_2.

The circuit board PCB may include a first detection pad PD1, a second detection pad PD2, and a third detection pad PD3. The first detection line L1 may be electrically connected to the first detection pad PD1, the second detection line L2 may be electrically connected to the second detection pad PD2, and the third detection line L3 may be electrically connected to the third detection pad PD3. The first detection pad PD1 includes a first sub-detection pad IPD1 and a second sub-detection pad OPD1 connected to the first sub-detection line L1_1 and the second sub-detection line L1_2, respectively. The second detection pad PD2 includes a third sub-detection pad PD2a and a fourth sub-detection pad PD2b connected to the third sub-detection line L2_1 and the fourth sub-detection line L2_2, respectively. The third detection pad PD3 includes a fifth sub-detection pad PD3a and a sixth sub-detection pad PD3b connected to the fifth sub-detection line L3_1 and the sixth sub-detection line L3_2, respectively.

The detector GM may detect a defect of the display device 1000 in the first inspection mode or the second inspection mode. The detector GM may detect a defect occurring in the display device 1000 by using the first to third crack lines CL1, CL2, and CL3 in the first detection mode (S200).

In the first inspection mode, the first detection pad PD1 is electrically connected to the first crack line CL1, the second detection pad PD2 is electrically connected to the second crack line CL2, and the third detection pad PD3 is electrically connected to the third crack line CL3. The first sub-detection pad IPD1 is connected to the input pad IP1 of the first crack line CL1, and the second sub-detection pad OPD1 is connected to the output pad OP1 of the first crack line CL1. The third sub-detection pad PD2a is connected to the first sub-connection pad CP2_1 of the second crack line CL2, and the fourth sub-detection pad PD2b is connected to the second sub-connection pad CP2_2 of the second crack line CL2. The fifth sub-detection pad PD3a is connected to the third sub-connection pad CP3_1 of the third crack line CL3, and the sixth sub-detection pad PD3b is connected to the fourth sub-connection pad CP3_2 of the third crack line CL3.

In the first inspection mode, the detector GM outputs the input signal C-IS, and the input signal C-IS is supplied to the first crack line CL1 through the first sub-detection line L1_1, the first sub-detection pad IPD1, and the input pad IP1. In the first inspection mode, the detector GM further outputs a first DC voltage and a second DC voltage. The output first DC voltage is supplied to the second crack line CL2 through the second detection line L2 and the second detection pad PD2, and the second DC voltage is supplied to the third crack line CL3 through the third detection line L3 and the third detection pad PD3.

The detector GM may receive an output signal C-OS fed back from the first crack line CL1 through the output pad OP1, the second sub-detection pad OPD1, and the second sub-detection line L1_2 in the first inspection mode. The detector GM may determine whether a defect is present using the received output signal C-OS. In addition, the detector GM may determine an upper defect, a lower defect, or upper and lower defects using the received output signal C-OS.

The detector GM may detect a defect occurring in the display device 1000 by using two crack lines among the first to third crack lines CL1, CL2, and CL3 in the second inspection mode (S300).

FIG. 11C illustrates that a position (hereinafter, a crack position, or defect position, P-CRK) of a crack is detected by using the first crack line CL1 and the second crack line CL2 of the first crack line CL1, the second crack line CL2, and the third crack line CL3. However, the present disclosure is not limited thereto. For example, the crack position P-CRK may be detected by using the first crack line CL1 and the third crack line CL3.

In the second detection mode, opposite ends of the first crack line CL1 may be electrically connected to a detector GMa, and the second crack line CL2 may be grounded (see reference numeral "GND"). When a crack occurs in one of the first crack line CL1 and the second crack line CL2, the first crack line CL1 and the second crack line CL2 may be electrically short-circuited with each other. In the crack position P-CRK, the first crack line CL1 may be electrically connected to the second crack line CL2 to be grounded (see reference numeral "GND").

Figure 12A:
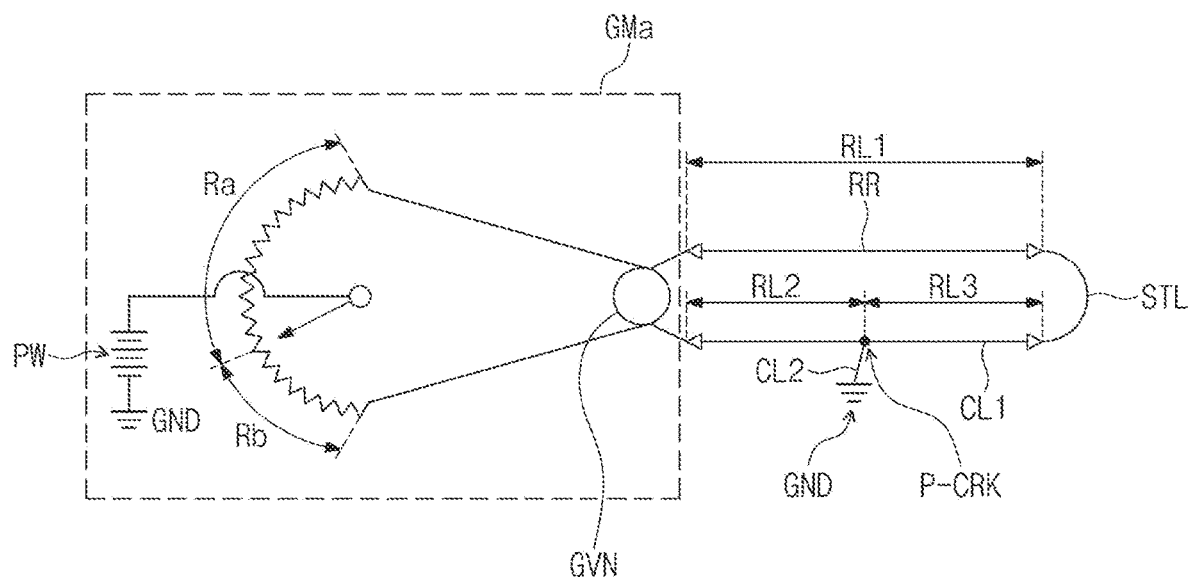
FIG. 12A is a view illustrating a defect position by a Murray Loop method according to one or more embodiments of the present disclosure.
Figure 12B:
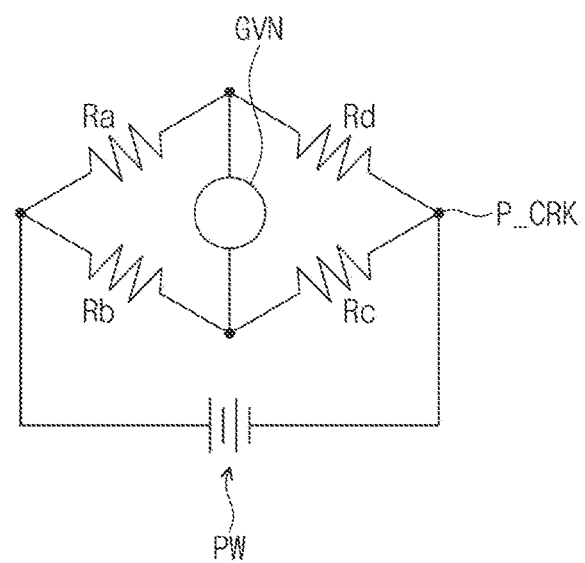
FIG. 12B is a circuit diagram for forming a Wheatstone Bridge according to one or more embodiments of the present disclosure.

FIG. 12A is a view illustrating a defect position by a Murray Loop method according to one or more embodiments of the present disclosure, and FIG. 12B is a circuit diagram for forming a Wheatstone Bridge according to one or more embodiments of the present disclosure.

Referring to FIGS. 11C, 12A, and 12B, the display device 1000 (see FIG. 1) and the detector GMa may analyze the crack position P-CRK through a Murray Loop method.

The detector GMa may include a first variable resistor Ra, a second variable resistor Rb, and a power source PW. One end of the power source PW may be grounded (see reference numeral "GND").

The detector GMa may be connected to the display device 1000 to form a Wheatstone Bridge circuit. The detector GMa may analyze the crack position P-CRK of the display device 1000 based on the Wheatstone bridge circuit. As illustrated in FIG. 12A, the first crack line CL1 may be connected to one end of a resistor line RR through a short-circuit line STL. The first crack line CL1 may be electrically connected to the second crack line CL2 at the crack position P-CRK.

The detector GMa may further include a galvanometer GVN to detect a potential difference of the Wheatstone bridge circuit. The detector GMa may be controlled such that the needle of the galvanometer GVN is positioned at a zero point by adjusting the sizes of the first variable resistor Ra and the second variable resistor Rb in the state that the power source PW is applied. In this case, the state, in which the needle of the galvanometer GVN is positioned at the zero point, may indicate an equilibrium state of the Wheatstone bridge circuit.

A third resistor Rc may be defined between the crack position P-CRK and one end of the first crack line CL1 connected to the detector GMa, and a fourth resistor Rd may be defined among the crack position P-CRK, the short-circuit line STL, and the resistor line RR.

The first crack line CL1 may have a resistance that is higher than that of the second crack line CL2. A current may suitably flow from the first crack line CL1 to the second crack line CL2, which suitably distinguishes between the third resistor Rc and the fourth resistor Rd.

The resistor line RR may have a first length RL1. A length from one end of the first crack line CL1 connected to the detector GMa to the crack position P-CRK may be defined as a second length RL2. A length from an opposite end of the first crack line CL1 connected to the short-circuit line STL to the crack position P-CRK may be defined as a third length RL3. In this case, because the resistor line RR has a length that is equal to the length of the first crack line CL1, the first length RL1 may be equal to the sum of the second length RL2 and the third length RL3.

The size of each of the third resistor Rc and the fourth resistor Rd may be determined by an equation of "rL/A". "r" may refer to a resistivity. "L" may refer to a length, and "A" may refer to cross-sectional area.

The size of the third resistor Rc may be proportional to the second length RL2, and the fourth resistor Rd may be proportional to the first length RL1 and the third length RL3. In other words, the fourth resistor Rd may be proportional to the sum of the first length RL1 and the third length RL3. In this case, the length of the short-circuit line STL may be negligibly small. The third length RL3 may be a value obtained by subtracting the second length RL2 from the first length RL1. Accordingly, the fourth resistor Rd may be proportional to a value (e.g., a fourth length) obtained by subtracting the second length RL2 from twice the first length RL1.

In the Wheatstone bridge circuit in an equilibrium state, the multiplication of values of resistors facing each other may be equal to each other, according to the equilibrium principle of the Wheatstone bridge circuit. The multiplication of the size of the first variable resistor Ra and the size of the third resistor Rc may be equal to the multiplication between the size of the second variable resistor Rb and the size of the fourth resistor Rd. In other words, the multiplication between the first variable resistor Ra and the second length RL2 may be equal to the multiplication between the size of the second variable resistor Rb and the fourth length. Accordingly, the following Equation 1 may be satisfied.

$$RaL \times RL2 = RbL(2 \times RL1 - RL2) \qquad \text{Equation 1}$$

In Equation 1, "RaL" is the size of the first variable resistor Ra, and "RbL" is the size of the second variable resistor Rb.

Equation 2 for the second length RL2 may be derived from Equation 1. In other words, the second length RL2 may satisfy Equation 2.

$$RL2 = \frac{(2 \times RbL \times RL1)}{RaL + RbL} \qquad \text{Equation 2}$$

The values of the first variable resistor Ra and the second variable resistor Rb may be found out through the measurement of the detector GMa. The first length RL1 may be found out from the length of the first crack line CL1 previously measured. Accordingly, the second length RL2, which is the distance from the galvanometer GVN to the crack position P-CRK, may be calculated through Equation 2. The crack position P-CRK may be detected based on the second length RL2.

As the crack position P-CRK is clearly detected from the second length RL2, the reliability for the inspection of the display device 1000 may be improved.

Although FIGS. 11C, 12A, and 12B illustrate that the detector GMa is connected to the first crack line CL1, the present disclosure is not limited thereto. When a defect occurs in the second crack line CL2 or the third crack line CL3 as a result of detection of the first detection mode, the second crack line CL2 or the third crack line CL3 may be connected to the detector GMa instead of the first crack line CL1. In this case, the detector GMa may detect a defect position in the second crack line CL2 or the third crack line CL3.

According to the present disclosure, the second crack line and the third crack line are additionally provided above or under the first crack line. Accordingly, whether any defect occurs from among the upper defect, the lower defect, and the upper-lower defect of the first crack line may be precisely measured by using the first crack line, the second crack line, and the third crack line.

In addition, the defective position is detected by using the two crack lines of the first crack line, the second crack line, and the third crack line, thereby improving the reliability in testing the defect of the display device.

Although one or more embodiments of the present disclosure has been described for illustrative purposes, those skilled in the art will appreciate that various modifications, and substitutions are possible, without departing from the scope and spirit of the invention as disclosed in the accompanying claims. Accordingly, the technical scope of the inventive concept is not limited to the detailed description of this specification, but should be defined by the claims.

While the present disclosure has been described with reference to embodiments thereof, it will be apparent to those of ordinary skill in the art that various changes and modifications may be made thereto without departing from the spirit and scope of the present disclosure as set forth in the following claims, with functional equivalents thereof to be included therein.

What is claimed is:

1. A display device comprising:
    a display panel comprising:
        an active region;
        a peripheral region adjacent to the active region;
        pixels in the active region;
        a first crack line in the peripheral region to surround a portion of the active region in plan view;
        a second crack line in the peripheral region, under the first crack line in a thickness direction of the display panel, and insulated from the first crack line; and
    a third crack line in the peripheral region, above the first crack line in the thickness direction, and insulated from the first crack line and the second crack line,
    wherein a defective crack line among the first crack line, the second crack line, and the third crack line is detected by using the first crack line, the second crack line, and the third crack line, in a first inspection mode, and
    wherein a defect position of the defective crack line is detected by using two crack lines of the first crack line, the second crack line, and the third crack line, in a second inspection mode.

2. The display device of claim 1, wherein the first crack line, the second crack line, and the third crack line overlap each other in plan view.

3. The display device of claim 1, wherein the display panel further comprises:
    a first insulating layer between the first crack line and the second crack line; and
    a second insulating layer between the first crack line and the third crack line.

4. The display device of claim 1, wherein the display panel further comprises:
    an input pad coupled to a first end of the first crack line;
    an output pad coupled to a second end of the first crack line;
    a first connection pad coupled to the second crack line; and
    a second connection pad coupled to the third crack line.

5. The display device of claim 4, wherein, an input signal is supplied to the input pad, and an output signal is output from the output pad, in the first inspection mode.

6. The display device of claim 5, wherein the input signal is an alternating current signal that swings between a first voltage level and a second voltage level that is higher than the first voltage level.

7. The display device of claim 6, wherein a first direct current voltage corresponding to the first voltage level is applied to the first connection pad, and a second direct current voltage corresponding to the second voltage level is applied to the second connection pad, in the first inspection mode.

8. The display device of claim 4, wherein, in the second inspection mode, one of the first crack line, the second crack line, or the third crack line is coupled to a detector, and
    wherein another one of the first crack line, the second crack line, or the third crack line is grounded.

9. The display device of claim 1, wherein the second crack line and the third crack line surround the portion of the active region along the first crack line in plan view.

10. The display device of claim 1, wherein a pattern hole is defined in the active region, and
    wherein the first crack line, the second crack line, and the third crack line surround a portion of the pattern hole.

11. The display device of claim 1, further comprising a driving circuit electrically coupled to the pixels,
    wherein the peripheral region comprises a first region adjacent to the active region, a second region spaced apart from the first region in a first direction, and a bending region between the first region and the second region, and
    wherein the driving circuit is at the second region.

12. The display device of claim 11, wherein the first crack line, the second crack line, and the third crack line are in the first region, the second region, and the bending region, respectively.

13. A method for inspecting a display device comprising a display panel comprising an active region, a peripheral region adjacent to the active region, pixels in the active region, a first crack line in the peripheral region to surround a portion of the active region, a second crack line in the peripheral region and under the first crack line in a thickness direction of the display panel, a third crack line in the peripheral region and above the first crack line in the thickness direction, and insulating layers respectively between respective ones of the first crack line, the second crack line, and the third crack line, when viewed in a plan view, the method comprising:
    detecting a defective crack line among the first crack line, the second crack line, and the third crack line using the first crack line, the second crack line, and the third crack line, in a first inspection mode; and
    analyzing a defect position of the defective crack line by using two crack lines of the first crack line, the second crack line, and the third crack line, in a second inspection mode.

14. The method of claim 13, wherein the display panel further comprises:
    an input pad coupled to a first end of the first crack line;
    an output pad coupled to a second end of the first crack line;
    a first connection pad coupled to the second crack line; and
    a second connection pad coupled to the third crack line.

15. The method of claim 14, wherein the detecting of the defective crack line in the first inspection mode comprises:
    supplying an input signal to the input pad; and
    receiving an output signal output from the output pad to detect the defective crack line as the second crack line or the third crack line.

16. The method of claim 15, wherein the input signal is an alternating current (AC) signal that swings between a first voltage level, and a second voltage level that is higher than the first voltage level.

17. The method of claim 16, wherein the detecting of the defective crack line in the first inspection mode further comprises:
    applying a first direct current voltage, which corresponds to the first voltage level, to the first connection pad; and
    applying a second direct current voltage, which corresponds to the second voltage level, to the second connection pad.

18. The method of claim 13, wherein the analyzing of the defective position comprises connecting a Murray loop tester to one of the two crack lines, and grounding another one of the two crack lines.

* * * * *